United States Patent
Shim et al.

(10) Patent No.: US 11,678,535 B2
(45) Date of Patent: Jun. 13, 2023

(54) DISPLAY PANEL HAVING A PLURALITY OF CONNECTION LINES IN THIRD AREA BEING ELECTRICALLY CONNECTED TO PLURALITY OF PIXELS OF FIRST AREA

(71) Applicant: Samsung Display Co., Ltd., Yongin-si (KR)

(72) Inventors: Junghoon Shim, Yongin-si (KR); Wonkyu Kwak, Yongin-si (KR); Sunghwan Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 240 days.

(21) Appl. No.: 17/115,931

(22) Filed: Dec. 9, 2020

(65) Prior Publication Data

US 2021/0193781 A1    Jun. 24, 2021

(30) Foreign Application Priority Data

Dec. 18, 2019    (KR) .................. 10-2019-0170208

(51) Int. Cl.
 *H01L 29/08* (2006.01)
 *H01L 27/32* (2006.01)
(52) U.S. Cl.
 CPC ...... *H01L 27/3276* (2013.01); *H01L 27/3234* (2013.01); *H01L 27/3262* (2013.01)
(58) Field of Classification Search
 CPC ............. H01L 27/3276; H01L 27/3234; H01L 27/3262
 USPC .......................................................... 257/40
 See application file for complete search history.

(56) References Cited

U.S. PATENT DOCUMENTS

| | | | |
|---|---|---|---|
| 8,952,998 B2 | 2/2015 | Gu et al. | |
| 10,361,391 B2 | 7/2019 | Kim et al. | |
| 10,535,290 B2 | 1/2020 | Choi et al. | |
| 2016/0365406 A1 | 12/2016 | Adachi et al. | |
| 2017/0162636 A1* | 6/2017 | Park | H01L 27/3232 |
| 2017/0330923 A1* | 11/2017 | Chung | H01L 27/1248 |
| 2018/0019288 A1* | 1/2018 | Yang | G06V 40/1318 |
| 2018/0129328 A1 | 5/2018 | Park et al. | |

(Continued)

FOREIGN PATENT DOCUMENTS

| KR | 10-2017-0079923 | 7/2017 |
|---|---|---|
| KR | 10-2018-0050473 | 5/2018 |

(Continued)

*Primary Examiner* — Phuc T Dang
(74) *Attorney, Agent, or Firm* — Kile Park Reed & Houtteman PLLC

(57) ABSTRACT

A display panel includes a substrate including a first area including a transmission area, a second area, and a third area, the second area and the third area being adjacent to the first area; a first pixel group and a second pixel group each disposed in the first area, the transmission area being disposed between the first pixel group and the second pixel group; first connection lines extending in a first direction and electrically connected to first pixels of the first pixel group; second connection lines extending in the first direction and electrically connected to second pixels of the second pixel group; and third connection lines extending in a second direction and disposed in the third area, the third connection lines being electrically connected to the first connection lines and the second connection lines.

20 Claims, 18 Drawing Sheets

(56) References Cited

U.S. PATENT DOCUMENTS

2019/0130818 A1    5/2019  Cho et al.
2019/0325805 A1*  10/2019  Moon .................. G09G 3/3233

FOREIGN PATENT DOCUMENTS

| KR | 10-1859105      | 5/2018  |
|----|-----------------|---------|
| KR | 10-2018-0079011 | 7/2018  |
| KR | 10-1923173      | 11/2018 |
| KR | 10-1938879      | 1/2019  |
| KR | 10-1975084      | 5/2019  |

* cited by examiner

DISPLAY PANEL HAVING A PLURALITY OF CONNECTION LINES IN THIRD AREA BEING ELECTRICALLY CONNECTED TO PLURALITY OF PIXELS OF FIRST AREA

CROSS-REFERENCE TO RELATED APPLICATIONS

This application claims priority to and benefits of Korean Patent Application No. 10-2019-0170208 under 35 U.S.C. § 119, filed on Dec. 18, 2019, in the Korean Intellectual Property Office, the entire contents of which are incorporated herein by reference.

BACKGROUND

1. Technical Field

One or more embodiments relate to a display device, and, to a display panel including an extended display area such that an image or images may be displayed even in a region in which a component may be arranged or disposed, and a display device including the display panel.

2. Description of the Related Art

The usage and applications of display devices have recently diversified. In addition, as display devices have become thinner and lighter, their range of use has gradually been extended.

As display devices are used in various ways, they have been designed to have various shapes. Furthermore, functions that may be combined or associated with the display devices are increasing.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

As ways of increasing functions that may be combined or associated with display devices, an embodiment may provide a display device including a first area in which a component such as a sensor or a camera may be arranged or disposed inside a display area. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display panel may include a substrate including a first area including a transmission area, a second area, and a third area, the second area and the third area being adjacent to the first area, a first pixel group and a second pixel group each disposed in the first area, the transmission area being disposed between the first pixel group and the second pixel group, a plurality of first connection lines extending in a first direction and electrically connected to a plurality of first pixels of the first pixel group, a plurality of second connection lines extending in the first direction and electrically connected to a plurality of second pixels of the second pixel group, and a plurality of third connection lines extending in a second direction and disposed in the third area, the plurality of third connection lines being electrically connected to the plurality of first connection lines and the plurality of second connection lines, wherein the second direction intersects the first direction.

The display panel may further include a plurality of wirings extending in the second direction in the second area, wherein the plurality of wirings may be electrically connected to the first pixel group and disconnected between the first pixel group and the second pixel group.

The plurality of wirings may include a data line supplying a data signal.

The plurality of wirings and the plurality of third connection lines may be disposed on a same layer.

The plurality of first connection lines and the plurality of second connection lines may be disposed on a same layer.

The display panel may further include a plurality of auxiliary wirings extending in the first direction and electrically connected to the plurality of second pixels.

The plurality of second connection lines may be electrically connected to the plurality of auxiliary wirings.

The display panel may further include a first metal layer disposed in the first area, wherein the first metal layer may overlap the first pixel group and the plurality of first connection lines.

The display panel may further include a second metal layer disposed in the first area, the second metal layer being apart from the first metal layer, wherein the second metal layer may overlap the second pixel group and the plurality of second connection lines.

The first metal layer and the second metal layer may receive a constant voltage from a conductive line.

Each of the plurality of first pixels and the plurality of second pixels may include a pixel circuit including a thin film transistor, the thin film transistor may include a semiconductor layer and a gate electrode overlapping at least a portion of the semiconductor layer, and the first metal layer and the second metal layer may be disposed between the substrate and the semiconductor layer.

The third area may include a non-display area surrounding the second area.

The third area may surround at least a portion of the first area and be disposed between the first area and the second area.

The display panel may further include a first conductive layer disposed over the substrate, and a second conductive layer disposed over the first conductive layer, wherein an insulating layer may be disposed between the first conductive layer and the second conductive layer, the plurality of third connection lines and the first conductive layer may include a same material, and the plurality of first connection lines and the plurality of second connection lines and the second conductive layer may include a same material.

Each of the plurality of first pixels and the plurality of second pixels may include a display element, and a pixel circuit including a thin film transistor. The thin film transistor may include a semiconductor layer, a gate electrode overlapping at least a portion of the semiconductor layer, and an electrode layer being electrically connected to the semiconductor layer. The plurality of third connection lines and the electrode layer may include a same material.

Each of the plurality of first pixels and the plurality of second pixels may include a contact metal layer disposed between the display element and the thin film transistor and electrically connecting the display element to the thin film transistor, and the plurality of first connection lines and the plurality of second connection lines and the contact metal layer may include a same material.

The first area may be at least partially surrounded by the second area.

A resolution of the first area may be lower than a resolution of the second area.

According to one or more embodiments, a display device may include a display panel including a substrate that may include a first area including a transmission area, a second area, and a third area, the second area and the third area being adjacent to the first area, and a component arranged to correspond to the first area of the display panel, wherein the display panel may include a first pixel group and a second pixel group each disposed in the first area, the transmission area being disposed between the first pixel group and the second pixel group, a plurality of first connection lines extending in a first direction and electrically connected to a plurality of first pixels of the first pixel group, a plurality of second connection lines extending in the first direction and electrically connected to a plurality of second pixels of the second pixel group, and a plurality of third connection lines extending in a second direction and disposed in the third area, the plurality of third connection lines being electrically connected to the plurality of first connection lines and the plurality of second connection lines, wherein the second direction intersects the first direction.

The component may include an imaging element.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
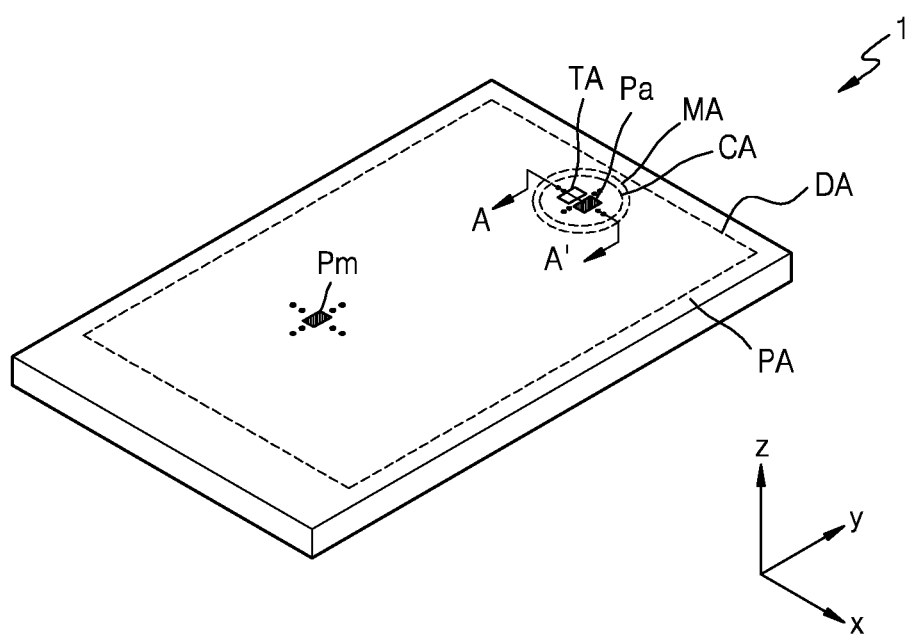
FIG. 1 is a perspective view of a display device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, embodiments are described in detail with reference to the accompanying drawings. In the drawings, the same reference numerals are given to the same or corresponding elements, and repeated description thereof is omitted.

It will be understood that although the terms "first," "second," etc. may be used herein to describe various components, these components should not be limited by these terms. These components are only used to distinguish one component from another. For instance, a first element or component discussed below could be termed a second element or component without departing from the teachings of the disclosure. Similarly, the second element or component could also be termed the first element or component.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween.

Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

Further, in the specification, the phrase "in a plan view" means when an object portion is viewed from above, and the phrase "in a schematic cross-sectional view" means when a schematic cross-section taken by vertically cutting an object portion is viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device 1 according to an embodiment.

Referring to FIG. 1, the display device 1 may include a first area CA, a second area DA (referred to as a display area hereinafter), and a third area PA, the display area DA displaying an image or images, and the third area PA not displaying an image or images. The display device 1 may display a main image by using light emitted from main pixels Pm arranged or disposed in the display area DA.

The first area CA may be at least partially surrounded by the display area DA. As described below with reference to FIG. 2, the first area CA may be a component area in which a component such as a sensor and/or a camera that uses an infrared ray, visible light, or sound may be arranged or disposed. The first area CA may include a transmission area TA through which light and/or sound that may be output to the outside from the component or progresses toward the component from the outside may pass. In an embodiment, in the case where an infrared ray passes through the first area CA, a light transmittance may be about 10% or more, for example, about 20% or more, about 25% or more, about 50% or more, about 85% or more, or about 90% or more.

In an embodiment, auxiliary pixels Pa may be arranged or disposed in the first area CA. The display device 1 may display a predetermined image by using light emitted from the auxiliary pixels Pa. An image displayed in the first area CA may be an auxiliary image. The resolution of the auxiliary image may be less than the resolution of an image displayed in the display area DA. Since the first area CA may include the transmission area TA through which light and/or sound may pass, the number of auxiliary pixels Pa that may be arranged or disposed per unit area in the first area CA may be less than the number of main pixels Pm that may be arranged or disposed per unit area in the display area DA.

The first area CA may be at least partially surrounded by the display area DA. In an embodiment, it is shown in FIG. 1 that the first area CA may be entirely surrounded by the display area DA.

The third area PA may surround or be adjacent to the display area DA in the outside and may be a non-display area in which pixels may not be arranged or disposed. Third connection lines CL3 (see FIG. 7) may be arranged or disposed in the third area PA to detour around the transmission area TA, the third connection lines CL3 may transfer a data signal to the auxiliary pixels Pa arranged or disposed in the first area CA. Since the connection lines CL3 may be arranged or disposed in the third area PA, a transmittance of the first area CA may be improved. This is described in detail with reference to FIG. 7.

In an embodiment, an intermediate area MA may be arranged or disposed between the first area CA and the display area DA. The third connection lines CL3 may be arranged or disposed in the intermediate area MA instead of the third area PA. In an embodiment, the third connection lines CL3 may be arranged or disposed in the third area PA and the intermediate area MA. In the case where the third connection lines CL3 may be arranged or disposed in the intermediate area MA, the intermediate area MA may be the non-display area in which pixels may not be arranged or disposed. In an embodiment, the intermediate area MA may be omitted.

Hereinafter, although the display device 1 according to an embodiment is described as an organic light-emitting display device as an example, the display device 1 according to an embodiment is not limited thereto. In an embodiment, the display device 1 according to an embodiment may include various types of display devices such as inorganic light-emitting displays and quantum dot light-emitting displays. For example, an emission layer of a display element provided or disposed to the display device 1 may include an organic material, include an inorganic material, include quantum dots, include an organic material and quantum dots, or include an inorganic material and quantum dots.

Although it is shown in FIG. 1 that the first area CA may be arranged or disposed on one side (an upper central region) of the display area DA, the embodiment is not limited thereto. The shape of the display area DA may be a circle, an ellipse, or a polygon such as a triangle or a pentagon. The location of the first area CA and the number of first areas CA may be variously changed within the spirit and the scope of the disclosure.

Figure 2:
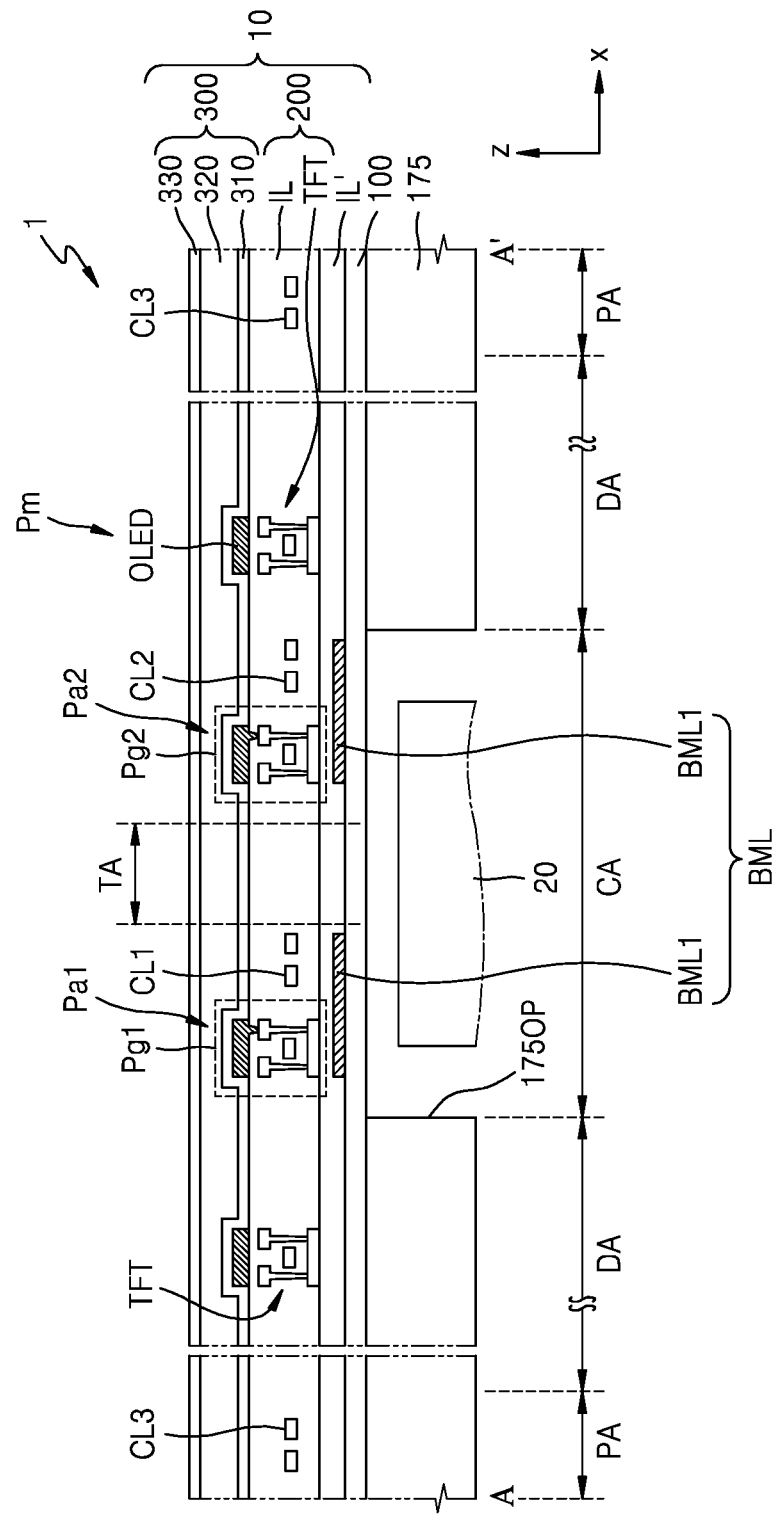
FIG. 2 is a schematic cross-sectional view of a display device according to an embodiment.

FIG. 2 is a schematic cross-sectional view of the display device 1 according to an embodiment, taken along line A-A' of FIG. 1.

Referring to FIG. 2, the display device 1 may include a display panel 10 and a component 20, the display panel 10 including a display element, and the component 20 corresponding to the first area CA.

The display panel 10 may include a substrate 100, a display element layer 200, and a thin-film encapsulation layer 300 as a sealing member, the display element layer 200 may be arranged or disposed on the substrate 100, and the thin-film encapsulation layer 300 sealing the display element layer 200. As an example, the display panel 10 may include a bottom protective film 175 arranged or disposed under or below the substrate 100.

The substrate 100 may include glass or a polymer resin. The polymer resin may include, for example, polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may be flexible, rollable, and/or bendable. The substrate 100 may have a multi-layered structure including a layer including the polymer resin and an inorganic layer (not shown).

The display element layer 200 may include a circuit layer, an organic light-emitting diode OLED as a display element, and insulating layers IL and IL' disposed therebetween, the circuit layer may include a thin film transistor TFT.

The main pixel Pm may be arranged or disposed in the display area DA, the main pixel Pm may include the thin film transistor TFT and the organic light-emitting diode electrically connected thereto.

First and second auxiliary pixels Pa1 and Pa2 may be arranged or disposed in the first area CA, each of the first and second auxiliary pixels Pa1 and Pa2 may include the thin film transistor TFT and the organic light-emitting diode electrically connected thereto. The first and second auxiliary pixels Pa1 and Pa2 may be grouped and defined as first and second pixel groups Pg1 and Pg2 in the first area CA. Although it is shown in FIG. 2 that the first and second pixel groups Pg1 and Pg2 respectively include one first and one second auxiliary pixels Pa1 and Pa2, the first and second pixel groups Pg1 and Pg2 may respectively include first auxiliary pixels Pa1 and second auxiliary pixels Pa2. First and second connection lines CL1 and CL2 may be respectively arranged or disposed on sides of the first and second pixel groups Pg1 and Pg2, the first and second connection lines CL1 and CL2 being respectively electrically connected to the first and second auxiliary pixels Pa1 and Pa2.

The transmission area TA may be arranged or disposed between the first and second pixel groups Pg1 and Pg2 in the first area CA. A display element may not be arranged or disposed in the transmission area TA. The transmission area TA may be a region through which light/signal that may be emitted from the component 20 or may be incident to the component 20 may pass.

The component 20 may be located or disposed in the first area CA. The component 20 may include an electronic element that uses light or sound. For example, the component 20 may be a sensor such as an infrared sensor that may emit and/or receive light, a sensor that may output and sense light or sound to measure a distance or recognize a fingerprint, a small lamp that may output light, a speaker that may output sound, and a camera including an imaging device. The electronic element that uses light may use light in various wavelength bands including visible light, infrared light, and ultraviolet light. The component 20 arranged or disposed in the first area CA may be provided in plural.

First and second metal layers BML1 and BML2 may be arranged or disposed in the first area CA. In an embodiment, the first metal layer BML1 may be arranged or disposed to correspond to the first pixel group Pg1 and the first connection line CL1, and the second metal layer BML2 may be arranged or disposed to correspond to the second pixel group Pg2 and the second connection line CL2. The first and second metal layers BML1 and BML2 may prevent external light, for example, light emitted from the component 20 from reaching the first and second pixel groups Pg1 and Pg2. Since the first and second metal layers BML1 and BML2 may prevent reflection or diffraction of light that may occur while external light passes between the first and second connection lines CL1 and CL2, an image distortion (for example flare, haze, or other distortions) in the first area CA may be prevented.

In an embodiment, a constant voltage or a signal may be applied to the first and second metal layers BML1 and BML2 and thus the damage of a pixel circuit by electrostatic discharge may be prevented. In an embodiment, the first and second metal layers BML1 and BML2 may receive different voltages.

The third area PA may surround or be adjacent to the display area DA. The third connection line CL3 may be arranged or disposed in the third area PA. The third connection lines CL3 may be respectively electrically connected to the first connection lines CL1 and the second connection lines CL2 such that the first connection lines CL1 may be electrically connected to the second connection lines CL2.

The thin-film encapsulation layer 300 may include at least one inorganic encapsulation layer and at least one organic encapsulation layer. With regard to this, FIG. 2 shows first and second inorganic encapsulation layers 310 and 330 and an organic encapsulation layer 320 disposed therebetween.

The first and second inorganic encapsulation layers 310 and 330 may include at least one inorganic insulating material among aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, polyimide, and polyethylene.

The bottom protective film 175 may be attached or adhered on a backside of the substrate 100 to support and protect the substrate 100. The bottom protective film 175 may include an opening 1750P corresponding to the first area CA. The bottom protective film 175 may improve a light transmittance of the first area CA by including the opening 1750P. The bottom protective film 175 may include polyethylene terephthalate (PET) or polyimide (PI), for example.

An area of the first area CA may be greater than an area in which the component 20 may be arranged or disposed. Therefore, an area of the opening 1750P of the bottom protective film 175 may not coincide with the area of the first area CA. For example, the area of the opening 1750P may be less than or different from an area of the first area CA.

Although not shown, elements such as an input sensing member, a reflection prevention member, and a transparent window may be arranged or disposed on the display panel 10, the input sensing member sensing a touch input, and the reflection prevention member including a polarizer and retarder, or a color filter and a black matrix.

Although the thin-film encapsulation layer 300 may be used as an encapsulation member sealing the display element layer 200 in an embodiment, the embodiment is not limited thereto. For example, as a member sealing the display element layer 200, a sealing substrate may be used, the sealing substrate being attached or adhered to the substrate 100 by a sealant or frit.

Figure 3:
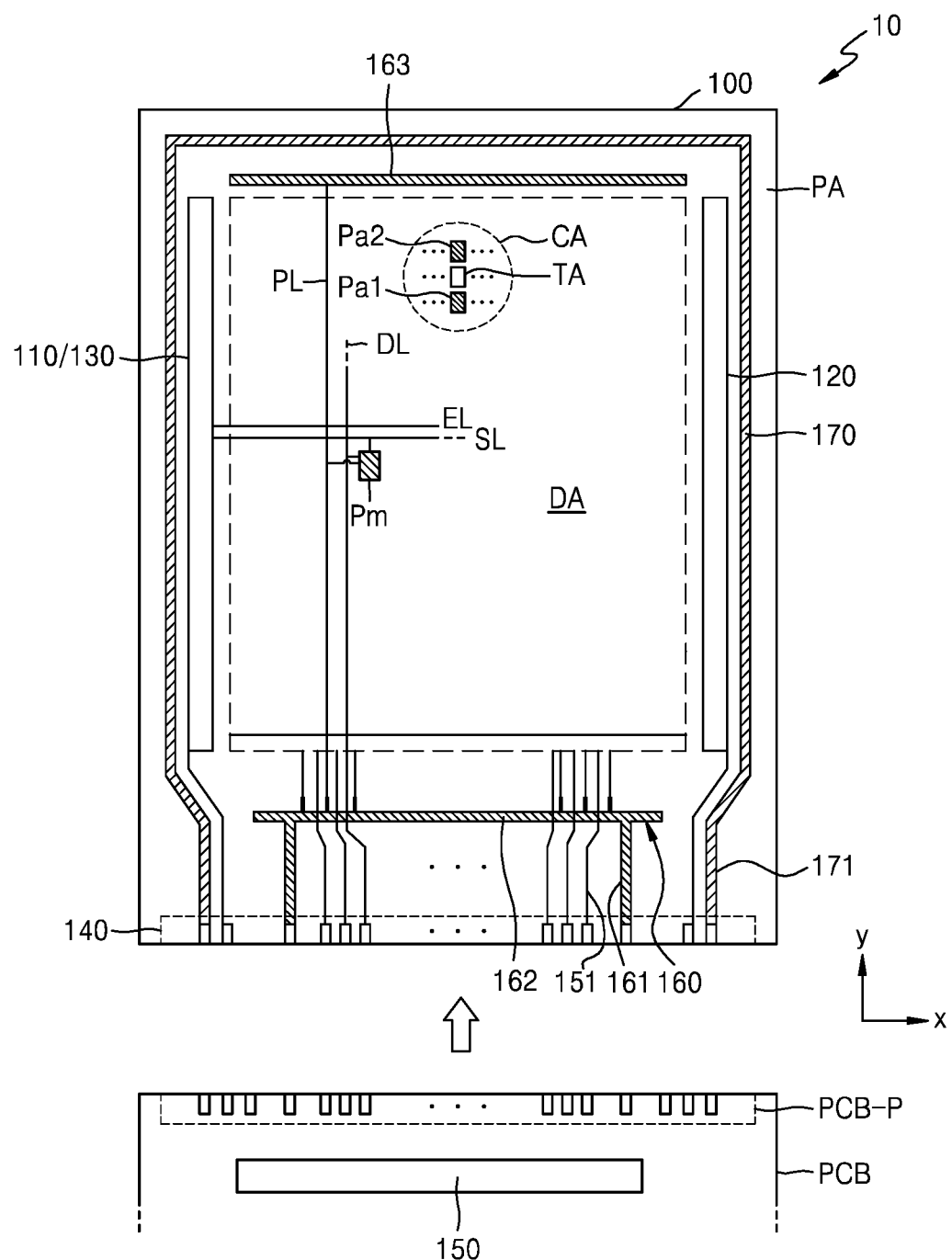
FIG. 3 is a plan view of a display panel according to an embodiment.

FIG. 3 is a plan view of the display panel 10 according to an embodiment.

Referring to FIG. 3, the display panel 10 may be arranged or disposed in the display area DA and may include main pixels Pm. Each of the main pixels Pm may include a display element such as an organic light-emitting diode. Each main pixel Pm may emit, for example, red, green, blue, or white light through the organic light-emitting diode. In the specification, the main pixel Pm may be a pixel emitting red, green, blue, or white light as described above. The display area DA may be protected from external air or moisture by being covered or overlapped by the encapsulation member described with reference to FIG. 2.

The first area CA may be arranged or disposed inside the display area DA. The first and second auxiliary pixels Pa1 and Pa2 may be arranged or disposed in the first area CA.

Each of the first and second auxiliary pixels Pa1 and Pa2 may include a display element such as an organic light-emitting diode. Each of the first and second auxiliary pixels Pa1 and Pa2 may emit red, green, blue, or white light by the organic light-emitting diode. In the specification, each of the first and second auxiliary pixels Pa1 and Pa2 may be a sub-pixel emitting red, green, blue, or white light as described above. Although not shown, each of the first and second auxiliary pixels Pa1 and Pa2 may be provided in plural to constitute the first and second pixel groups Pg1 and Pg2.

The transmission area TA may be arranged or disposed between the first and second auxiliary pixels Pa1 and Pa2 in the first area CA.

Since the first area CA may include the transmission area TA, the resolution of the first area CA may be less than the resolution of the display area DA. For example, the resolution of the first area CA may be about ½ of the resolution of the display area DA. In an embodiment, the resolution of the display area DA may be about 400 ppi or more, and the resolution of the first area CA may be about 200 ppi or more, about 100 ppi, or about 50 ppi.

In an embodiment, one main pixel Pm and one auxiliary pixel Pa may include the same pixel circuit. However, an embodiment is not limited thereto. A pixel circuit of the main pixel Pm may be different from a pixel circuit of the auxiliary pixel Pa. Hereinafter, on the assumption that the main pixel Pm and the auxiliary pixel Pa include the same pixel circuit, a circuit arrangement of the display panel 10 centering on the main pixel Pm is described.

Each of the pixels, for example, the main pixel Pm, the first auxiliary pixel Pa1, and the second auxiliary pixel Pa2 may be electrically connected to outer circuits arranged or disposed in the third area PA. A first scan driving circuit 110, a second scan driving circuit 120, an emission control driving circuit 130, a terminal 140, a data driving circuit 150, a first power supply line 160, and a second power supply line 170 may be arranged or disposed in the third area PA.

The first scan driving circuit 110 may provide a scan signal to the pixels, for example, the main pixel Pm, the first auxiliary pixel Pa1, and the second auxiliary pixel Pa2 through a scan line SL. The first scan driving circuit 110 may provide an emission control signal to the pixels, for example, the main pixel Pm, the first auxiliary pixel Pa1, and the second auxiliary pixel Pa2 through an emission control line EL. The second scan driving circuit 120 may be arranged or disposed in parallel to the first scan driving circuit 110 with the display area DA disposed therebetween. Some or a predetermined number of the pixels, for example, the main pixel Pm, the first auxiliary pixel Pa1, and the second auxiliary pixel Pa2 arranged or disposed in the display area DA may be electrically connected to the first scan driving circuit 110, and the rest or remainder of the pixels, for example, the main pixel Pm, the first auxiliary pixel Pa1, and the second auxiliary pixel Pa2 may be electrically connected to the second scan driving circuit 120. In an embodiment, the second scan driving circuit 120 may be omitted. Pixels P may be collectively referred to as the main pixel Pm, the first auxiliary pixel Pa1, and the second auxiliary pixel Pa2.

The terminal 140 may be arranged or disposed on a side of the substrate 100. The terminal 140 may be exposed and electrically connected to a printed circuit board PCB by not being covered or overlapped by an insulating layer. A terminal PCB-P of the printed circuit board PCB may be electrically connected to the terminal 140 of the display panel 10. The printed circuit board PCB may transfer a signal of a controller (not shown) or power to the display panel 10. Control signals generated by the controller may be respectively transferred to the first and second scan driving circuits 110 and 120 through the printed circuit board PCB. The controller may respectively provide first and second power voltages ELVDD and ELVSS (see FIGS. 4A and 4B described below) to the first and second power supply lines 160 and 170 through first and second connection lines 161 and 171. The first power voltage ELVDD may be provided to the pixels, for example, the main pixel Pm, the first auxiliary pixel Pa1, and the second auxiliary pixel Pa2 through a driving voltage line PL electrically connected to the first power supply line 160, and the second power voltage ELVSS may be provided to an opposite electrode of the pixels, for example, the main pixel Pm, the first auxiliary pixel Pa1, and the second auxiliary pixel Pa2 electrically connected to the second power supply line 170.

The data driving circuit 150 may be electrically connected to a data line DL. A data signal of the data driving circuit 150 may be provided to the pixels, for example, the main pixel Pm, the first auxiliary pixel Pa1, and the second auxiliary pixel Pa2 through a connection line 151 and the data line DL, the connection line 151 may be electrically connected to the terminal 140, and the data line DL may be electrically connected to the connection line 151. Although it is shown in FIG. 3 that the data driving circuit 150 may be arranged or disposed on the printed circuit board PCB, the data driving circuit 150 may be arranged or disposed on the substrate 100 in an embodiment. For example, the data driving circuit 150 may be arranged or disposed between the terminal 140 and the first power supply line 160.

The first power supply line 160 may include a first sub-line 162 and a second sub-line 163 that may be parallel to each other with the display area DA disposed therebetween and extending in an x-direction. The second power supply line 170 may have a substantially loop shape having an open side and may partially surround the display area DA.

Figure 4A:
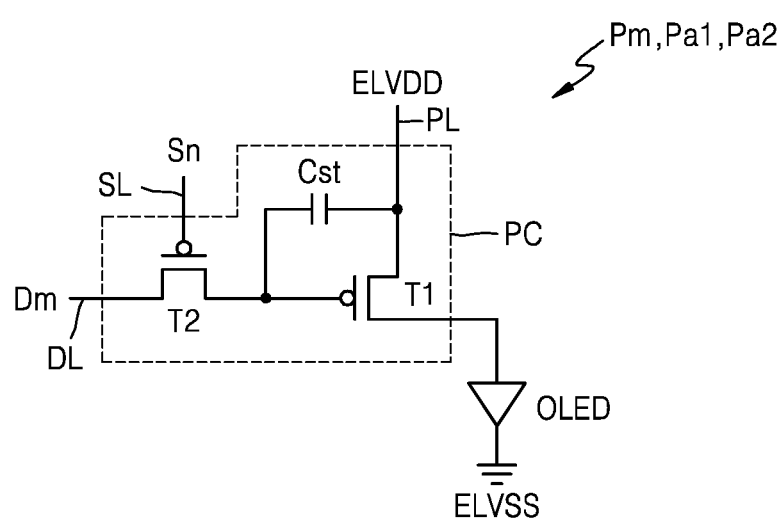
FIGS. 4A and 4B are equivalent circuit diagrams of a main pixel and/or an auxiliary pixel that may be included in a display panel according to an embodiment.
Figure 4B:
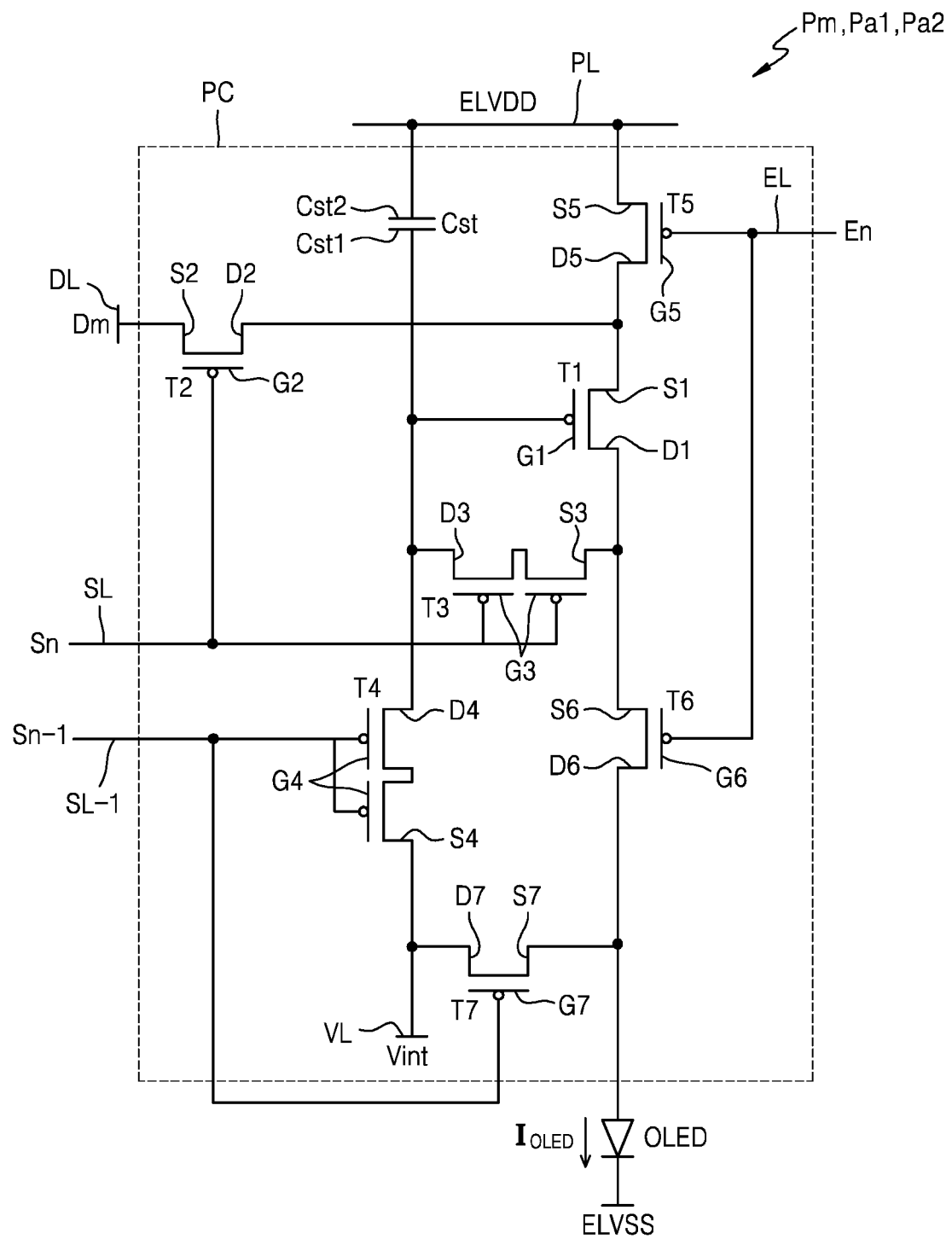

FIGS. 4A and 4B are equivalent circuit diagrams of a main pixel Pm and/or an auxiliary pixel Pa that may be included in the display panel 10 according to an embodiment.

Referring to FIG. 4A, the pixels, for example, the main pixel Pm, the first auxiliary pixel Pa1, and the second auxiliary pixel Pa2 may include a pixel circuit PC and an organic light-emitting diode OLED electrically connected to the pixel circuit PC, the pixel circuit PC may be electrically connected to a scan line SL and a data line DL.

The pixel circuit PC may include a driving thin film transistor T1, a switching thin film transistor T2, and a storage capacitor Cst. The switching thin film transistor T2 may be electrically connected to the scan line SL and the data line DL and may transfer a data signal Dm input through the data line DL to the driving thin film transistor T1 in response to a scan signal Sn input through the scan line SL.

The storage capacitor Cst may be electrically connected to the switching thin film transistor T2 and the driving voltage line PL, and may store a voltage corresponding to a difference between a voltage transferred from the switching thin film transistor T2 and the first power voltage ELVDD (or a driving voltage) supplied to the driving voltage line PL.

The driving thin film transistor T1 may be electrically connected to the driving voltage line PL and the storage capacitor Cst, and may control a driving current flowing through the organic light-emitting diode OLED from the driving voltage line PL in response to a voltage stored in the storage capacitor Cst. The organic light-emitting diode OLED may emit light having a predetermined brightness by using the driving current.

Although it is shown in FIG. 4A that the pixel circuit PC may include two thin film transistors and one storage capacitor, an embodiment is not limited thereto. As shown in FIG. 4B, the pixel circuit PC may include seven thin film transistors and one storage capacitor.

Referring to FIG. 4B, the pixels, for example, the main pixel Pm, the first auxiliary pixel Pa1, and the second auxiliary pixel Pa2 may include the pixel circuit PC and the organic light-emitting diode OLED electrically connected to the pixel circuit PC. The pixel circuit PC may include thin film transistors and a storage capacitor. The thin film transistors and the storage capacitor may be electrically connected to signal lines SL, SL-1, EL, and DL, an initialization voltage line VL, and the driving voltage line PL.

Although it is shown in FIG. 4B that the pixels, for example, the main pixel Pm, the first auxiliary pixel Pa1, and the second auxiliary pixel Pa2 may be electrically connected to the signal lines SL, SL-1, EL, and DL, the initialization voltage line VL, and the driving voltage line PL, an embodiment is not limited thereto. In an embodiment, at least one of the signal lines SL, SL-1, EL, and DL, the initialization voltage line VL, and the driving voltage line PL may be shared by pixels that may neighbor each other.

The thin film transistors may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line SL, the previous scan line SL-1, the emission control line EL, and the data line DL, the scan line SL may transfer a scan signal Sn, the previous scan line SL-1 may transfer a previous scan signal Sn-1 to a first initialization thin film transistor T4 and a second initialization thin film transistor T7, the emission control line EL may transfer an emission control signal En to an operation control thin film transistor T5 and an emission control thin film transistor T6, and the data line DL intersecting with the scan line SL and may transfer a data signal Dm. The driving voltage line PL may transfer the driving voltage ELVDD to the driving thin film transistor T1, and the initialization voltage line VL may transfer an initialization voltage Vint initializing the driving thin film transistor T1 and a pixel electrode of the organic light-emitting diode OLED.

A driving gate electrode G1 of the driving thin film transistor T1 may be electrically connected to a first storage capacitor plate Cst1 of the storage capacitor Cst, a driving source electrode S1 of the driving thin film transistor T1 may be electrically connected to the driving voltage line PL through the operation control thin film transistor T5, and a driving drain electrode D1 of the driving thin film transistor T1 may be electrically connected to the pixel electrode of an organic light-emitting diode OLED through the emission control thin film transistor T6. The driving thin film transistor T1 may receive a data signal Dm depending on a switching operation of a switching thin film transistor T2 and supply a driving current IOLED to the organic light-emitting diode OLED.

A switching gate electrode G2 of the switching thin film transistor T2 may be electrically connected to the scan line SL, a switching source electrode S2 of the switching thin film transistor T2 may be electrically connected to the data line DL, and a switching drain electrode D2 of the switching thin film transistor T2 may be electrically connected to the driving source electrode S1 of the driving thin film transistor T1 and may be simultaneously electrically connected to the driving voltage line PL through the operation control thin film transistor T5. The switching thin film transistor T2 may be turned on in response to a scan signal Sn transferred through the scan line SL and may perform a switching operation of transferring a data signal Dm transferred through the data line DL to the driving source electrode S1 of the driving thin film transistor T1.

A compensation gate electrode G3 of a compensation thin film transistor T3 may be electrically connected to the scan line SL, a compensation source electrode S3 of the compensation thin film transistor T3 may be electrically connected to the driving drain electrode D1 of the driving thin film transistor T1 and may be simultaneously electrically connected to the pixel electrode of the organic light-emitting diode OLED through the emission control thin film transistor T6, and a compensation drain electrode D3 of the compensation thin film transistor T3 may be electrically connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 may be turned on in response to a scan signal Sn transferred through the scan line SL and may diode-connect the driving thin film transistor T1 by electrically connecting the driving gate electrode G1 to the driving drain electrode D1 of the driving thin film transistor T1.

A first initialization gate electrode G4 of the first initialization thin film transistor T4 may be electrically connected to the previous scan line SL-1, a first initialization source electrode S4 of the first initialization thin film transistor T4 may be electrically connected to a second initialization drain electrode D7 of the second initialization thin film transistor T7 and the initialization voltage line VL, and a first initialization drain electrode D4 of the first initialization thin film transistor T4 may be electrically connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 may be turned on in response to a previous scan signal Sn-1 transferred through the previous scan line SL-1 and may perform an initialization operation of initializing a voltage of the driving gate electrode G1 of the driving thin film transistor T1 by transferring the initialization voltage to the driving gate electrode G1 of the driving thin film transistor T1.

An operation control gate electrode G5 of the operation control thin film transistor T5 may be electrically connected to the emission control line EL, an operation control source electrode S5 of the operation control thin film transistor T5 may be electrically connected to the driving voltage line PL, and an operation control drain electrode D5 of the operation control thin film transistor T5 may be electrically connected to the driving source electrode S1 of the driving thin film transistor T1 and the switching drain electrode D2 of the switching thin film transistor T2.

An emission control gate electrode G6 of the emission control thin film transistor T6 may be electrically connected to the emission control line EL, an emission control source electrode S6 of the emission control thin film transistor T6 may be electrically connected to the driving drain electrode D1 of the driving thin film transistor T1 and the compensation source electrode S3 of the compensation thin film transistor T3, and an emission control drain electrode D6 of the emission control thin film transistor T6 may be electrically connected to the second initialization source electrode S7 of the second initialization thin film transistor T7 and the pixel electrode of the organic light-emitting diode OLED.

The operation control thin film transistor T5 and the emission control thin film transistor T6 may be simultaneously turned on in response to an emission control signal En transferred through the emission control line EL to allow the driving voltage ELVDD to be transferred to the organic light-emitting diode OLED and thus the driving current IOLED to flow through the organic light-emitting diode OLED.

A second initialization gate electrode G7 of the second initialization thin film transistor T7 may be electrically connected to the previous scan line SL-1, the second initialization source electrode S7 of the second initialization thin film transistor T7 may be electrically connected to the emission control drain electrode D6 of the emission control thin film transistor T6 and the pixel electrode of the organic light-emitting diode OLED, and the second initialization drain electrode D7 of the second initialization thin film transistor T7 may be electrically connected to the first initialization source electrode S4 of the first initialization thin film transistor T4 and the initialization voltage line VL. The second initialization thin film transistor T7 may be turned on in response to a previous scan signal Sn-1 transferred through the previous scan line SL-1 and may initialize the pixel electrode of the organic light-emitting diode OLED.

Although FIG. 4B shows the case where the first initialization thin film transistor T4 and the second initialization thin film transistor T7 may be electrically connected to the previous scan line SL-1, an embodiment is not limited thereto. In an embodiment, the first initialization thin film transistor T4 may be electrically connected to the previous scan line SL-1 and driven in response to a previous scan signal Sn-1, and the second initialization thin film transistor T7 may be electrically connected to a separate signal line (for example, the next scan line) and driven in response to a signal transferred through the separate signal line.

A second storage capacitor plate Cst2 of the storage capacitor Cst may be electrically connected to the driving voltage line PL, and an opposite electrode of the organic light-emitting diode OLED may be electrically connected to the common voltage ELVSS. Therefore, the organic light-emitting diode OLED may receive the driving current IOLED from the driving thin film transistor T1 and may emit light to thereby display an image.

Although it is shown in FIG. 4B that the compensation thin film transistor T3 and the first initialization thin film transistor T4 each have a dual gate electrode, the compensation thin film transistor T3 and the first initialization thin film transistor T4 may each have one gate electrode.

In an embodiment, the main pixel Pm, the first auxiliary pixel Pa1, and the second auxiliary pixel Pa2 may include the same pixel circuit PC. However, an embodiment is not limited thereto. The main pixel Pm, the first auxiliary pixel Pa1, and the second auxiliary pixel Pa2 may respectively include pixel circuits PC having different structures. For example, the main pixel Pm may employ the pixel circuit PC shown in FIG. 4B, and the first auxiliary pixel Pa1 and the second auxiliary pixel Pa2 may employ the pixel circuit PC shown in FIG. 4A. Various modifications may be made within the spirit and the scope of the disclosure.

Figure 5:
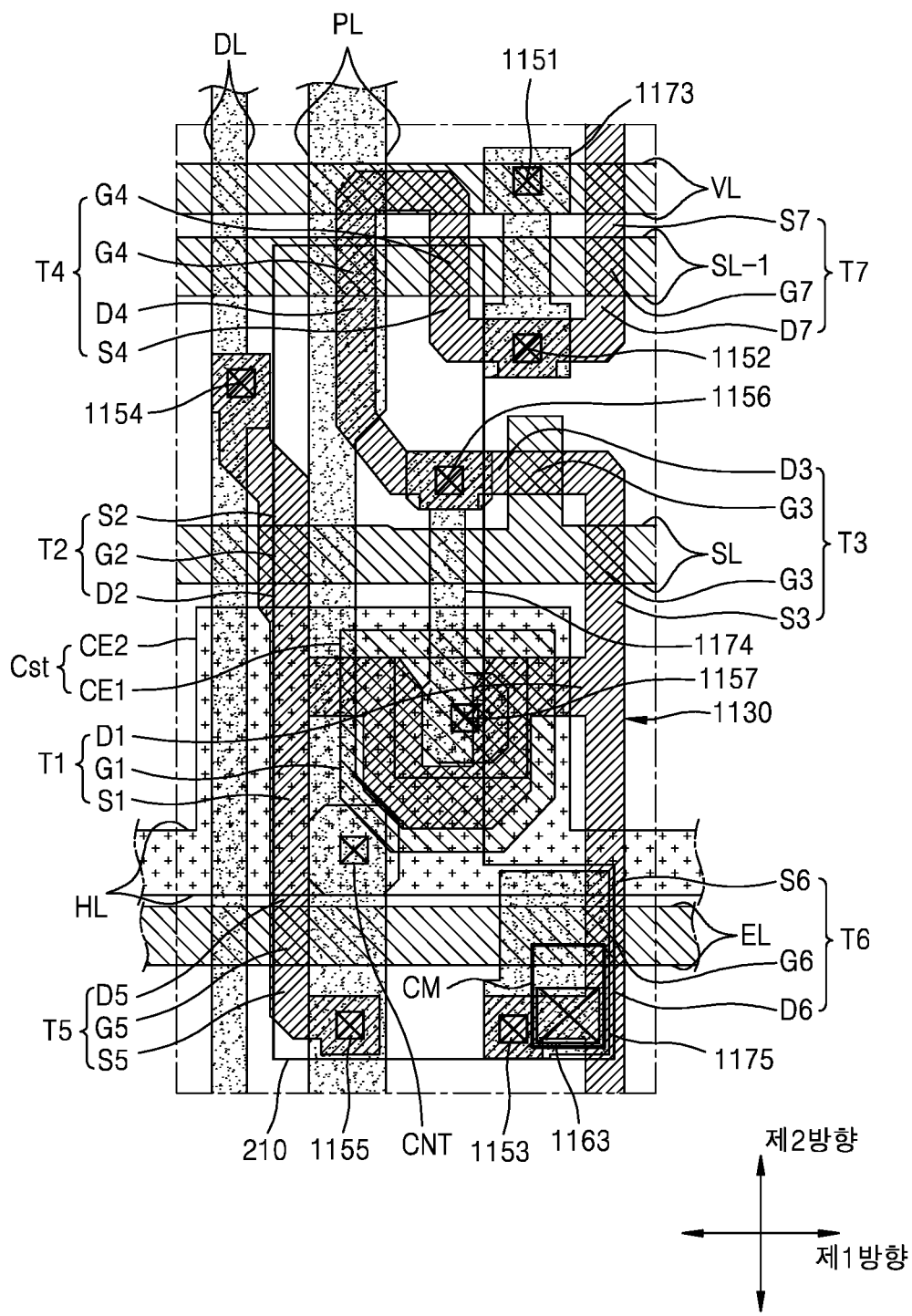
FIG. 5 is an arrangement view of a pixel circuit of a pixel of a display panel according to an embodiment.

FIG. 5 is an arrangement view of the pixel circuit PC of a pixel of the display panel 10 according to an embodiment.

Referring to FIG. 5, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged or disposed along a semiconductor layer 1130. The semiconductor layer 1130 may be arranged or disposed over the substrate on which a buffer layer may be formed or disposed, the buffer layer may include an inorganic insulating material.

Some regions of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be electrically connected to each other and may be bent in various shapes.

The semiconductor layer 1130 may include a channel, a source region, and a drain region, the source region and the drain region disposed on two opposite sides of the channel region. The source region and the drain region may be a source electrode and a drain electrode of a relevant or predetermined thin film transistor. Hereinafter, for convenience of description, the source region and the drain region may be respectively referred to as the source electrode and the drain electrode.

The driving thin film transistor T1 may include the driving gate electrode G1, the driving source electrode S1, and the driving drain electrode D1, the driving gate electrode G1 may overlap a driving channel region, and the driving source electrode S1 and the driving drain electrode D1 may be on two opposite sides of the driving channel region. The driving channel region may overlap the driving gate electrode G1 may form a long channel length inside a narrow space by having a substantially bent shape such as an omega or arch shape. In the case where the length of the driving channel region is long, the driving range of a gate voltage may be widened and thus the gray scale of light emitted from the organic light-emitting diode OLED may be more elaborately controlled and display quality may be improved.

The switching thin film transistor T2 may include the switching gate electrode G2, the switching source electrode S2, and the switching drain electrode D2, the switching gate electrode G2 may overlap a switching channel region, and the switching source electrode S2 and the switching drain electrode D2 may be disposed on two opposite sides of the switching channel region. The switching drain electrode D2 may be electrically connected to the driving source electrode S1.

The compensation thin film transistor T3 may be a dual thin film transistor and may include compensation gate electrodes G3, the compensation source electrode S3, and the compensation drain electrode D3, the compensation gate electrodes G3 may overlap two compensation channel regions, and the compensation source electrode S3 and the compensation drain electrode D3 may be disposed on two opposite sides of the compensation channel regions. The compensation thin film transistor T3 may be electrically connected to the driving gate electrode G1 of the driving thin film transistor T1 through a node connection line 1174 described below.

The first initialization thin film transistor T4 may be a dual thin film transistor and may include first initialization gate electrodes G4, the first initialization source electrode S4, and the first initialization drain electrode D4, the first initialization gate electrodes G4 may overlap two first initialization channel regions, and the first initialization source electrode S4 and the first initialization drain electrode D4 may be disposed on two opposite sides of the first initialization channel regions.

The operation control thin film transistor T5 may include the operation control gate electrode G5, the operation control source electrode S5, and the operation control drain electrode D5, the operation control gate electrode G5 may overlap an operation control channel region, and the operation control source electrode S5 and the operation control drain electrode D5 may be disposed on two opposite sides of the operation control channel region. The operation control drain electrode D5 may be electrically connected to the driving source electrode S1.

The emission control thin film transistor T6 may include the emission control gate electrode G6, the emission control source electrode S6, and the emission control drain electrode D6, the emission control gate electrode G6 may overlap an emission control channel region, and the emission control source electrode S6 and the emission control drain electrode D6 may be disposed on two opposite sides of the emission control channel region. The emission control source electrode S6 may be electrically connected to the driving drain electrode D1.

The second initialization thin film transistor T7 may include the second initialization gate electrode G7, the second initialization source electrode S7, and the second initialization drain electrode D7, the second initialization gate electrode G7 may overlap a second initialization channel region, and the second initialization source electrode S7 and the second initialization drain electrode D7 may be disposed on two opposite sides of the second initialization channel region.

The thin film transistors may be electrically connected to the signal lines SL, SL-1, EL, and DL, the initialization voltage line VL, and the driving voltage line PL.

The scan line SL, the previous scan line SL-1, the emission control line EL, and the driving gate electrode G1 may be arranged or disposed over the semiconductor layer 1130 with an insulating layer(s) disposed therebetween.

The scan line SL may extend in a first direction. Regions or portions of the scan lines SL may respectively correspond to the switching gate electrode G4 and the compensation gate electrode G7. For example, regions of the scan line SL that may respectively overlap the channel regions of the first and second initialization thin film transistors T4 and T7 may be the first initialization gate electrode G4 and the second initialization gate electrode G7, respectively.

The previous scan line SL-1 may extend in the first direction and some regions or portions of the previous scan line SL-1 may respectively correspond to the first initialization gate electrode G4 and the second initialization gate electrode G7. For example, the regions of the previous scan lines SL-1 that may respectively overlap the channel regions of the first and second initialization thin film transistors T4 and T7 may be the first initialization gate electrode G4 and the second initialization gate electrode G7, respectively.

The emission control line EL may extend in the first direction. Regions of the emission control line EL may respectively correspond to the operation control gate electrode G5 and the emission control gate electrode G6. For example, regions of the emission control line EL that may respectively overlap the channel regions of the operation control thin film transistor T6 and the emission control thin film transistor T7 may be the operation control gate electrode G5 and the emission control gate electrode G6, respectively.

The driving gate electrode G1 may be a floating electrode and may be electrically connected to the compensation thin film transistor T3 through the node connection line 1174 described above.

An electrode voltage line HL may be arranged or disposed over the scan line SL, the previous scan line SL-1, the emission control line EL, and the driving gate electrode G1 with an insulating layer(s) disposed therebetween.

The electrode voltage line HL may extend in the first direction to intersect the data line DL and the driving voltage line PL. A portion of the electrode voltage line HL may cover or overlap at least a portion of the driving gate electrode G1 and may constitute the storage capacitor Cst in cooperation with the driving gate electrode G1. For example, the driving gate electrode G1 may serve as a first storage capacitor plate CE1 (also referred to as a bottom electrode) of the storage capacitor Cst, and a portion of the electrode voltage line HL may serve as a second storage capacitor plate CE2 (also referred to as a top electrode) of the storage capacitor Cst.

The second storage capacitor plate CE2 of the storage capacitor Cst may be electrically connected to the driving voltage line PL. With regard to this, the electrode voltage line HL may be electrically connected to the driving voltage line PL through a contact hole CNT, the driving voltage line PL being arranged or disposed over the electrode voltage line HL. Therefore, the electrode voltage line HL may have the same voltage level (a constant voltage) as that of the driving voltage line PL. For example, the electrode voltage line HL may have a constant voltage of about +5V. The electrode voltage line HL may be a transverse driving voltage line.

Since the driving voltage line PL may extend in a second direction, and the electrode voltage line HL electrically connected to the driving voltage line PL may extend in the first direction intersecting the second direction, driving voltage lines PL and electrode voltage lines HL may constitute a mesh structure in the display area DA.

The data line DL, the driving voltage line PL, an initialization connection line 1173, and the node connection line 1174 may be arranged or disposed over the electrode voltage line HL with an insulating layer(s) disposed therebetween.

The data line DL may extend in the second direction and may be electrically connected to the switching source electrode S2 of the switching thin film transistor T2 through a contact hole 1154. A portion or region of the data line DL may be the switching source electrode S2.

The driving voltage line PL may extend in the second direction and may be electrically connected to the electrode voltage line HL through a contact hole CNT as described above. The driving voltage line PL may be electrically connected to the operation control thin film transistor T5 through a contact hole 1155. The driving voltage line PL may be electrically connected to the operation control drain electrode D5 through a contact hole 1155.

An end of the initialization connection line 1173 may be electrically connected to the first and second initialization thin film transistors T4 and T7 through a contact hole 1152, and another end of the initialization connection line 1173 may be electrically connected to the initialization voltage line VL described below through a contact hole 1151.

An end of the node connection line 1174 may be electrically connected to the compensation drain electrode D3 through a contact hole 1156, and another end of the node connection line 1174 may be electrically connected to the driving gate electrode G1 through a contact hole 1157.

The initialization voltage line VL may be arranged or disposed over the data line DL, the driving voltage line PL, the initialization connection line 1173, and the node connection line 1174 with an insulating layer(s) disposed therebetween.

The initialization voltage line VL may extend in the first direction. The initialization voltage line VL may be electrically connected to the first and second initialization thin film transistors T4 and T7 through the initialization connection line 1173. The initialization voltage line VL may have a constant voltage (for example, of about −2V).

The initialization voltage line VL may be arranged or disposed on the same layer as a pixel electrode 210 of the organic light-emitting diode OLED and may include the same or similar material as that of the pixel electrode 210. The pixel electrode 210 may be electrically connected to the emission control thin film transistor T6. The pixel electrode 210 may be electrically connected to a connection metal 1175 through a contact hole 1163, and the connection metal 1175 may be electrically connected to the emission control drain electrode D6 through a contact hole 1153.

Although it is shown in FIG. 5 that the initialization voltage line VL may be arranged or disposed on the same layer as the pixel electrode 210, the initialization voltage line VL may be arranged or disposed on the same layer as the electrode voltage line HL in an embodiment.

Figure 6:
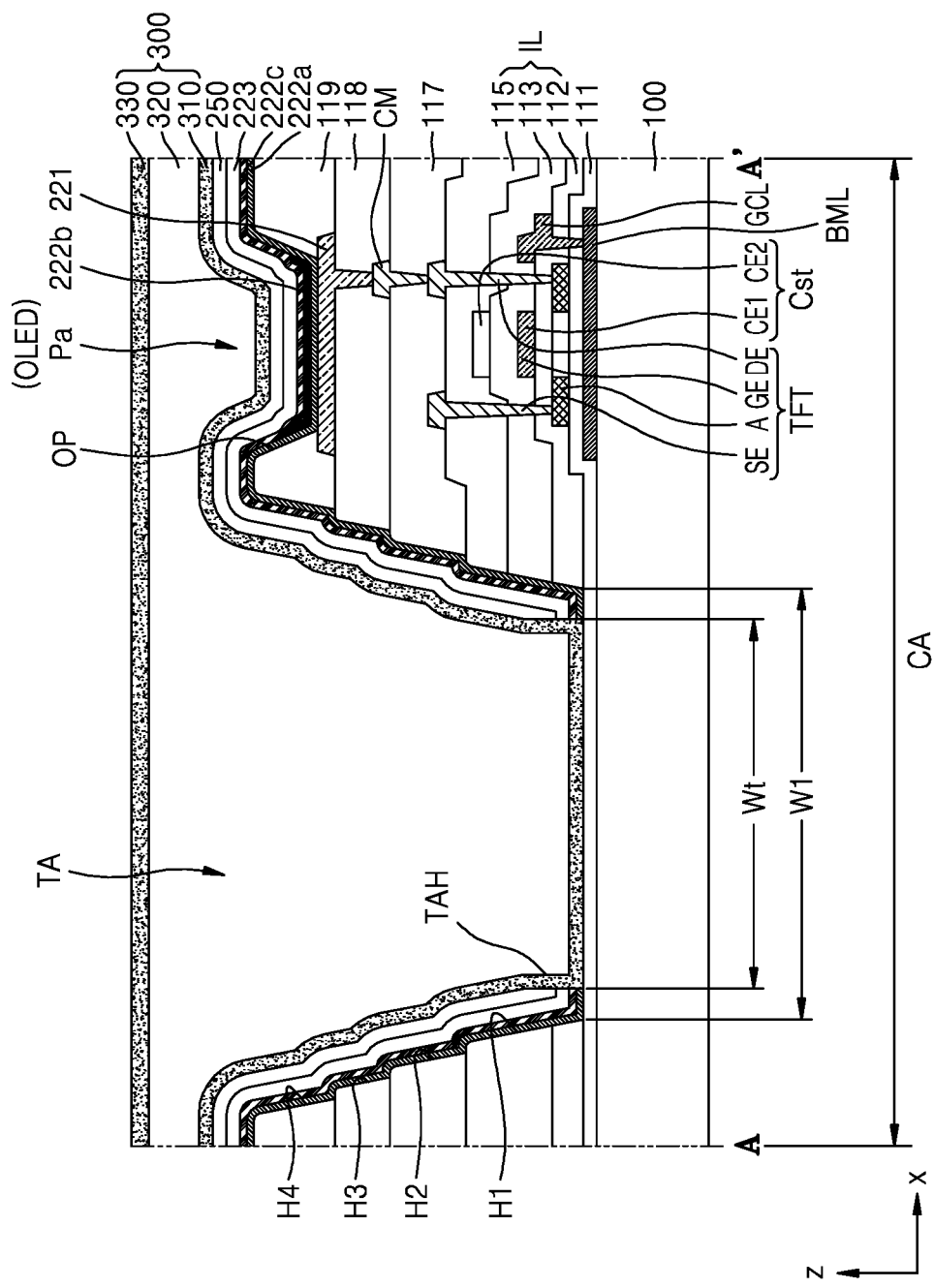
FIG. 6 is a schematic cross-sectional view of a pixel circuit of a pixel according to an embodiment.

FIG. 6 is a schematic cross-sectional view of the pixel circuit PC of a pixel according to an embodiment.

Referring to FIG. 6, the auxiliary pixel Pa (referred to as a pixel hereinafter) and the transmission area TA may be arranged or disposed in the first area CA. A stacked structure of the pixel Pa may be described centering on a schematic cross-sectional structure of the first area CA.

The pixel Pa may include a thin film transistor TFT, a storage capacitor Cst, and an organic light-emitting diode OLED. To secure a transmittance, the transmission area TA may include a transmission hole TAH in which some insulating layers may be removed.

A metal layer BML may be arranged or disposed below the thin film transistor TFT of the pixel Pa, the metal layer BML may overlap the thin film transistor TFT. Different from that of FIG. 6, the metal layer BML that may overlap the thin film transistor TFT may be omitted.

The substrate 100 may include a polymer resin. The substrate 100 may include at least one base layer and at least one inorganic layer, the at least one base layer including an organic material. Although not shown, in an embodiment, the substrate 100 may include a first base layer, a first inorganic layer, a second base layer, and a second inorganic layer that may be sequentially stacked. The first and second base layers each may include a polymer resin. The first and second inorganic layers each may be barrier layers and may include a single layer or a multi-layer including an inorganic material such as silicon nitride (SiNx) and/or silicon oxide (SiOx).

A buffer layer 111 may be arranged or disposed on the substrate 100 and may reduce or block the penetration of foreign substances, moisture, or external air from below the substrate 100 and provide a flat surface on the substrate 100. The buffer layer 111 may include an inorganic material such as an oxide or a nitride, an organic material, or an organic/inorganic composite material and may include a single layer or a multi-layer including an inorganic material and an organic material.

The metal layer BML may be arranged or disposed between the substrate 100 and the buffer layer 111. In an embodiment, the metal layer BML may be arranged or disposed between the second base layer and the second inorganic layer. In an embodiment, the metal layer BML may be provided in plural in the first area CA, and some of the metal layers BML may be arranged or disposed on different layers.

The metal layer BML may be arranged or disposed below the pixel Pa to prevent the thin film transistor TFT arranged or disposed in the pixel Pa from being damaged or prevent the characteristic of the thin film transistor TFT from being deteriorated.

The metal layer BML may be electrically connected to a conductive line GCL arranged or disposed on a different layer through a contact hole. The metal layer BML may receive a constant voltage or a signal from the conductive line GCL. For example, the metal layer BML may receive the driving voltage ELVDD or a scan signal. Since the metal layer BML may receive the driving voltage ELVDD or a signal, a probability that electrostatic discharge occurs may be remarkably reduced. In an embodiment, all the metal layers BML may not receive an electric signal. In the case where the metal layer BML is provided in plural, at least one of the metal layers BML may be electrically floated, and the rest of the metal layers BML may receive an electric signal. Various modifications may be made within the spirit and the scope of the disclosure.

The metal layer BML may include at least one of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The metal layer BML may include a single layer or a multi-layer including the above materials.

A thin film transistor TFT may be arranged or disposed on the buffer layer 111. The thin film transistor TFT may include a semiconductor layer A, a gate electrode GE, a source electrode SE, and a drain electrode DE, the source electrode SE and the drain electrode DE may be electrode layers. The thin film transistor TFT may be electrically connected to an organic light-emitting diode OLED to drive the organic light-emitting diode OLED.

The semiconductor layer A may be arranged or disposed on the buffer layer 111 and may include polycrystalline silicon. In an embodiment, the semiconductor layer A may include amorphous silicon. In an embodiment, the semiconductor layer A may include an oxide of at least one of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer A may include a channel region, a source region, and a drain region, the source region and the drain region may be doped with impurities.

The semiconductor layer A may overlap the metal layer BML with the buffer layer 111 disposed therebetween. In an embodiment, a width of the semiconductor layer A may be less than a width of the metal layer BML. Therefore, when projected in a direction perpendicular to the substrate 100, the semiconductor layer A may entirely overlap the metal layer BML. In an embodiment, the metal layer BML may be provided or disposed to correspond to a pixel group Pg formed by pixels Pa. In this case, the semiconductor layers A may overlap the metal layer BML.

A first gate insulating layer 112 may cover or overlap the semiconductor layer A. The first gate insulating layer 112 may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), and hafnium oxide (HfO2), and zinc oxide (ZnO2). The first gate insulating layer 112 may include a single layer or a multi-layer including the inorganic insulating material.

The gate electrode GE may be arranged or disposed over the first gate insulating layer 112 to overlap the semiconductor layer A. The gate electrode GE may include a single layer or a multi-layer including molybdenum (Mo), aluminum (Al), copper (Cu), and titanium (Ti). For example, the gate electrode GE may be a single layer including molybdenum (Mo).

A second gate insulating layer 113 may cover or overlap the gate electrode GE. The second gate insulating layer 113 may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), and hafnium oxide (HfO2), and zinc oxide (ZnO2). The second gate insulating layer 113 may include a single layer or a multi-layer including the inorganic insulating material.

A top electrode CE2 of the storage capacitor Cst may be arranged or disposed on the second gate insulating layer 113. In the pixel circuit PC according to an embodiment, the top electrode CE2 may overlap the gate electrode GE therebelow. The gate electrode GE and the top electrode CE2 overlapping each other with the second gate insulating layer 113 disposed therebetween may constitute the storage capacitor Cst. The gate electrode GE may serve a bottom electrode CE1 of the storage capacitor Cst.

The top electrode CE2 may include at least one of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

An interlayer insulating layer 115 may cover or overlap the top electrode CE2. The interlayer insulating layer 115 may include silicon oxide (SiO2), silicon nitride (SiNx), silicon oxynitride (SiON), aluminum oxide (Al2O3), titanium oxide (TiO2), tantalum oxide ($Ta_2O_5$), and hafnium oxide (HfO2), or zinc oxide (ZnO2).

When the first gate insulating layer 112, the second gate insulating layer 113, and the interlayer insulating layer 115 are collectively referred to as an inorganic insulating layer IL, the inorganic insulating layer IL may include a first hole H1 corresponding to the transmission area TA. The first hole H1 may expose a top surface of the buffer layer 111 or the substrate 100. The first hole H1 may include openings respectively of the first gate insulating layer 112, the second gate insulating layer 113, and the interlayer insulating layer 115 that may overlap each other and correspond to the transmission area TA. The openings may be respectively formed through a separate process or simultaneously formed through the same process. In the case where the openings are formed through a separate process, a step difference may be formed on an inner surface of the first hole H1.

In an embodiment, the inorganic insulating layer IL may include a groove instead of the first hole H1 exposing the buffer layer 111.

In an embodiment, the inorganic insulating layer IL may not include the first hole H1 corresponding to the transmission area TA. Since the inorganic insulating layer IL may generally include an inorganic insulating material having an excellent light transmittance, even though the inorganic insulating layer IL does not include a hole corresponding to the transmission area TA, a transmittance for light that may be transmitted/received by the component 20 (see FIG. 2) may be implemented.

The source electrode SE and the drain electrode DE may be understood as the electrode layers may be arranged or disposed on the interlayer insulating layer 115. The source electrode SE and the drain electrode DE may include a conductive material including molybdenum (Mo), aluminum (Al), copper (Cu), and titanium (Ti) and may include a single layer or a multi-layer including the above materials. For example, the source electrode SE and the drain electrode DE may include a multi-layered structure of Ti/A/Ti.

A first planarization layer 117 may cover or overlap the source electrode SE and the drain electrode DE. The first planarization layer 117 may have a flat top surface such that a pixel electrode 221 arranged or disposed thereon may be formed flat.

A second planarization layer 118 may be arranged or disposed on the first planarization layer 117. A contact metal layer CM may be arranged or disposed between the first planarization layer 117 and the second planarization layer 118. The contact metal layer CM may electrically connect the drain electrode DE to the pixel electrode 221 through contact holes respectively formed in the first planarization layer 117 and the second planarization layer 118.

The first planarization layer 117 and the second planarization layer 118 may include a single layer or a multi-layer including an organic material or an inorganic material. The first planarization layer 117 and the second planarization layer 118 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The first planarization layer 117 and the second planarization layer 119 may include silicon oxide (SiO2), silicon nitride (SiNx), silicon oxynitride (SiON), aluminum oxide (Al2O3), titanium oxide (TiO2), tantalum oxide (Ta2O5), and hafnium oxide (HfO2), or zinc oxide (ZnO2). After the first planarization layer 117 and the second planarization layer 119 are formed, chemical mechanical polishing may be performed to provide a flat top surface. However, the disclosure is not limited thereto and other processes may be employed to provide a flat top surface within the spirit and the scope of the disclosure.

The first planarization layer 117 and the second planarization layer 119 may include a second hole H2 corresponding to the transmission area TA. The second hole H2 may overlap the first hole H1. Although it is shown in FIG. 6 that the second hole H2 may be greater than the first hole H1, the first planarization layer 117 and the second planarization layer 119 may be provided or disposed to cover or overlap the edges of the first hole H1 of the inorganic insulating layer IL and thus the width of the second hole H2 may be less than the width of the first hole H1.

The pixel electrode 221 on the second planarization layer 119 may include a conductive oxide such as indium tin oxide (ITO), indium zinc oxide (IZO), zinc oxide (ZnO), indium oxide (In2O3), indium gallium oxide (IGO), and aluminum zinc oxide (AZO). In an embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an embodiment, the pixel electrode 221 may include a layer including ITO, IZO, ZnO, or In2O3 on/under/below the reflective layer. In an embodiment, the pixel electrode 221 may include a stacked structure of ITO/Ag/ITO.

A pixel-defining layer 119 may cover or overlap the edges of the pixel electrode 221. The pixel-defining layer 119 may include an opening OP overlapping each pixel electrode 221 and defining an emission area of a pixel. The opening OP may be defined as an emission area of the pixel Pa. The pixel-defining layer 119 may prevent an arc, for example, from occurring at the edges of the pixel electrode 221 by increasing a distance between the edges of the pixel electrode 221 and an opposite electrode 223 disposed over the pixel electrode 221. The pixel-defining layer 119 may include an organic insulating material including polyimide, polyamide, an acrylic resin, benzocyclobutene, HMDSO, and a phenolic resin and may be formed by spin coating or other processes within the spirit and the scope of the disclosure.

The pixel-defining layer 119 may include a third hole H3 located or disposed in the transmission area TA. The third hole H3 may overlap the first hole H1 and the second hole H2. When the first to third holes H1, H2, and H3 are formed, a light transmittance of the transmission area TA may be improved. The opposite electrode 223 described below may be arranged or disposed on inner lateral walls of the first to third holes H1, H2, and H3. The pixel-defining layer 119 may include a fourth hole H4 as shown in FIG. 6, however, the disclosure is not limited thereto. The pixel-defining layer 119 may include any number of holes so that a light transmittance of the transmission area TA may be improved.

A first functional layer 222a may cover or overlap the pixel-defining layer 119. The first functional layer 222a may include a single layer or a multi-layer. Although not shown, first functional layer 222a may include a hole transport layer (HTL), which may have a single-layered structure. Although not shown, alternatively, the first functional layer 222a may include a hole injection layer (HIL) and an HTL. The first functional layer 222a may include one body to correspond, in common, with the pixels Pa included in the first area CA and the display area DA.

An emission layer 222b may be arranged or disposed on the first functional layer 222a, the emission layer 222b corresponding to each of the pixels 221. The emission layer 222b may include a polymer material or a low molecular weight material and may emit red, green, blue, or white light.

A second functional layer 222c may be formed or disposed on the emission layer 222b. The second functional layer 222c may include a single layer or a multi-layer. Although not shown, the second functional layer 222c may include an electron transport layer (ETL) and/or an electron injection layer (EIL). The second functional layer 222c may include one body to correspond, in common, to the pixels Pa included in the first area CA and the display area DA. In an embodiment, the first functional layer 222a and/or the second functional layer 222c may be omitted.

The opposite electrode 223 may be arranged or disposed on the second functional layer 222c. The opposite electrode 223 may include a conductive material having a low work function. For example, the opposite electrode 223 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 223 may include a layer including ITO, IZO, ZnO, or In2O3 on/under/below the (semi)-transparent layer including the above materials. The opposite electrode 223 may be provided as one body in the first area CA and the display area DA.

The pixel electrode 221, the opposite electrode 223, and the layers arranged or disposed therebetween in the display area DA may constitute the organic light-emitting diode OLED.

A capping layer 250 may be formed or disposed on the opposite electrode 223. The capping layer 250 may include, for example, lithium fluoride (LiF). Alternatively, the capping layer 250 may include an inorganic insulating material such as silicon nitride and/or include an organic insulating material. In an embodiment, the capping layer 250 may be omitted.

The first functional layer 222a, the second functional layer 222c, the opposite electrode 223, and the capping layer 250 may include the transmission hole TAH corresponding to the transmission area TA. For example, the first functional layer 222a, the second functional layer 222c, the opposite electrode 223, and the capping layer 250 may respectively include openings corresponding to the transmission area TA. In an embodiment, widths of the openings that may form the transmission hole TAH may be substantially the same. For example, a width of the opening of the opposite electrode 223 may be substantially the same as a width of the transmission hole TAH.

When the transmission hole TAH corresponds to the transmission area TA, the transmission hole TAH may overlap the transmission area TA. In this case, the area of the transmission hole TAH may be less than the area of the first hole H1 formed in the inorganic insulating layer IL. For this, it is shown in FIG. 6 that a width Wt of the transmission hole TAH is less than a width W1 of the first hole H1. Here, the area of the transmission hole TAH and the area of the first hole H1 may be defined as the area of the opening having a smallest area.

In a case that the transmission hole TAH is provided, a portion of the opposite electrode 223 may be removed from the transmission area TA, and through this, a light transmittance of the transmission area TA may be remarkably increased. The opposite electrode 223 located or disposed in the first area CA may be formed by removing a portion of the opposite electrode 223 that may correspond to the transmission area TA through a laser lift-off, or formed through fine metal mask (FMM) mask patterning. Hereinafter, in an embodiment, description is made on the assumption that the opposite electrode 223 is formed in the first area CA through the FMM mask patterning. However, the disclosure is not limited thereto.

The organic light-emitting diode OLED may be sealed by the thin-film encapsulation layer 300. The thin-film encapsulation layer 300 may be arranged or disposed on the capping layer 250. The thin-film encapsulation layer 300 may prevent the penetration of external moisture or foreign substances into the organic light-emitting diode OLED.

The organic light-emitting diode OLED may include at least one inorganic encapsulation layer and at least one organic encapsulation layer. With regard to this, it is shown in FIG. 6 that the thin-film encapsulation layer 300 has a structure in which the first inorganic encapsulation layer 310, the organic encapsulation layer 320, and the second inorganic encapsulation layer 330 are stacked. In an embodiment, the number of organic encapsulation layers, the number of inorganic encapsulation layers, and a stacking sequence may be modified.

The first and second inorganic encapsulation layers 310 and 330 may include at least one inorganic insulating material such as aluminum oxide, titanium oxide, tantalum oxide, hafnium oxide, zinc oxide, silicon oxide, silicon nitride, and silicon oxynitride and may be formed by using chemical vapor deposition (CVD). However, the disclosure is not limited thereto. The organic encapsulation layer 320 may include a polymer-based material. The polymer-based material may include a silicon-based resin, an acryl-based resin, an epoxy-based resin, polyimide, and polyethylene.

Each of the first inorganic encapsulation layer 310, the organic encapsulation layer 320, and the second inorganic encapsulation layer 330 may include one body to cover or overlap the display area DA and the component area CA. Accordingly, the first inorganic encapsulation layer 310, the organic encapsulation layer 320, and the second inorganic encapsulation layer 330 may be arranged or disposed inside the transmission hole TAH.

In an embodiment, the organic encapsulation layer 320 may include one body to cover or overlap the display area DA and the first area CA and may not be provided or disposed in the transmission area TA. In other words, the organic encapsulation layer 320 may include an opening corresponding to the transmission area TA. In this case, the first inorganic encapsulation layer 310 may contact the second inorganic encapsulation layer 330 inside the transmission hole TAH.

Figure 7:
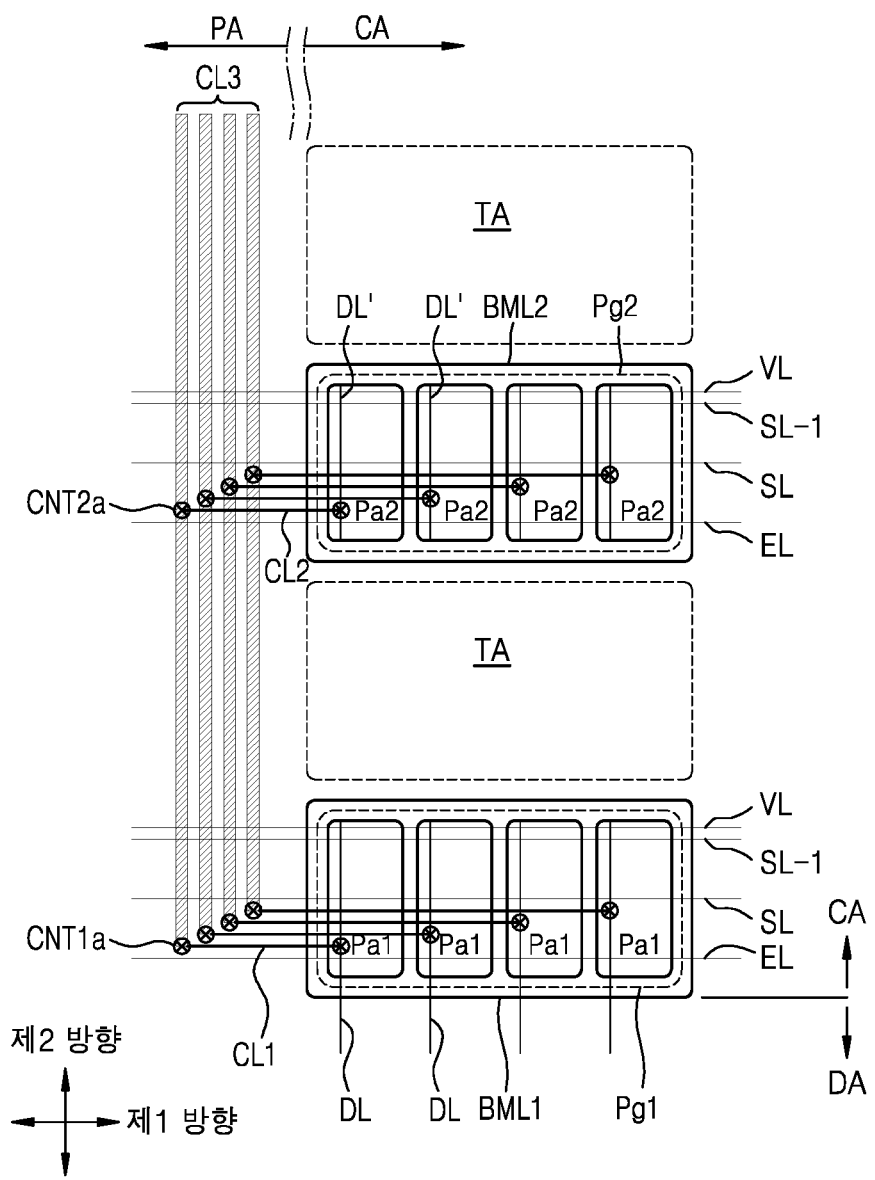
FIG. 7 is a plan view of a portion or a region of a display device according to an embodiment.
Figure 8:
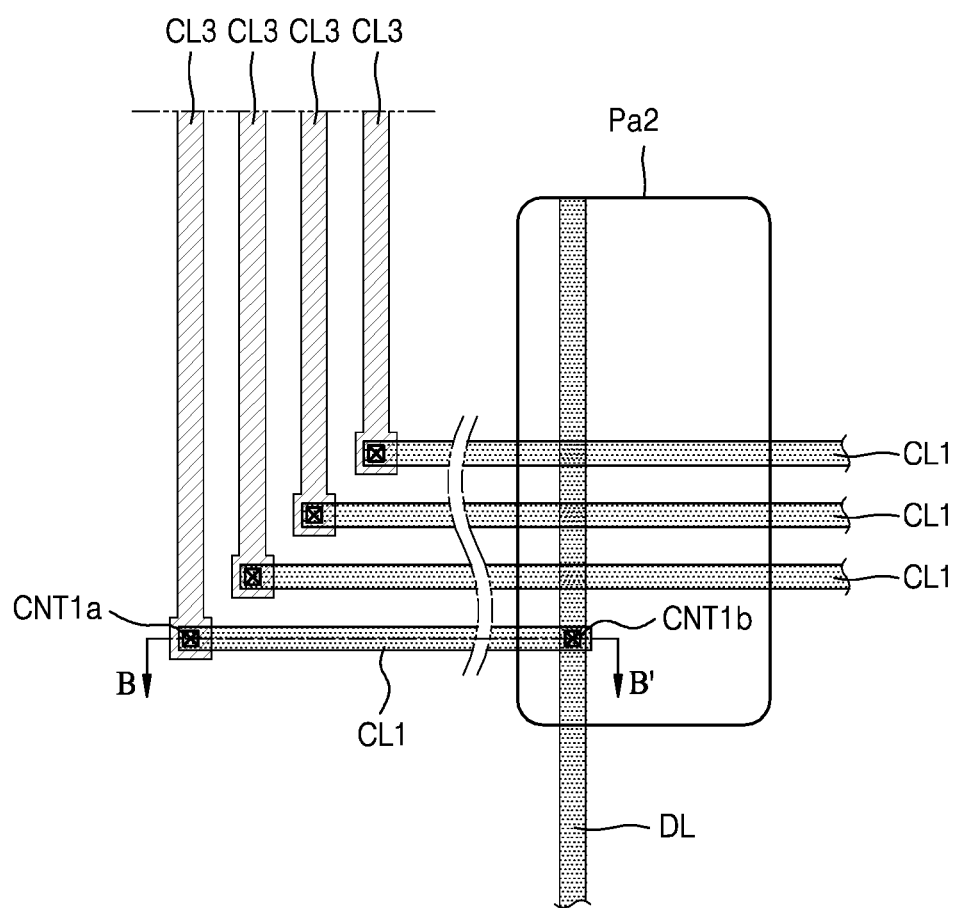
FIG. 8 is an enlarged plan view of a portion or a region of FIG. 7.
Figure 9A:
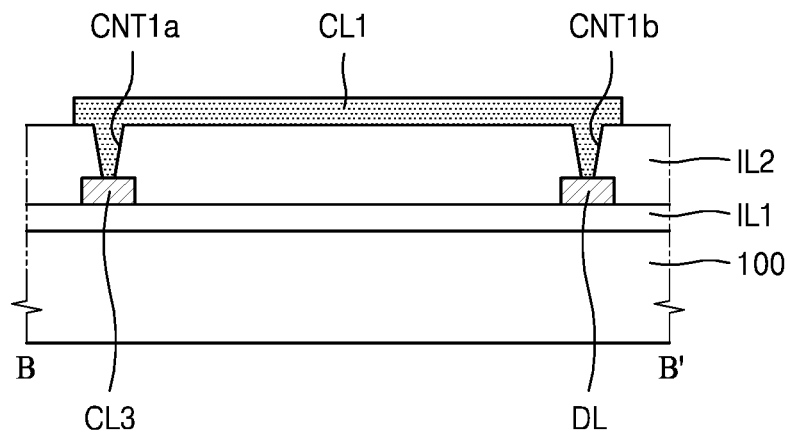
FIGS. 9A and 9B are schematic cross-sectional views taken along line B-B of FIG. 8.
Figure 9B:
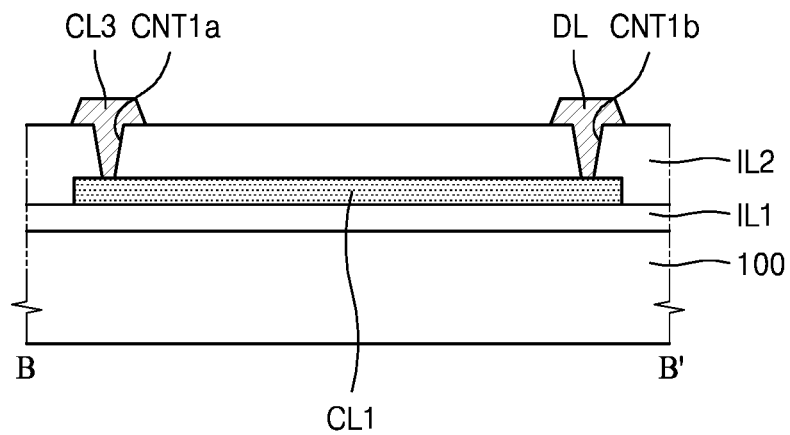

FIG. 7 is a plan view of a portion or a region of the display device 1 according to an embodiment, FIG. 8 is an enlarged plan view of a portion or a region of FIG. 7, and FIGS. 9A and 9B are schematic cross-sectional views of the display device 1 taken along line B-B' of FIG. 8.

Referring to FIG. 7, a first pixel group Pg1 and a second pixel group Pg2 may be arranged or disposed with the transmission area TA disposed therebetween in the first area CA. Although FIG. 7 shows one first pixel group Pg1 and one second pixel group Pg2, the first pixel group Pg1 and the second pixel group Pg2 may be provided in plural as shown in FIG. 8. The first pixel group Pg1 and the second pixel group Pg2 may be apart from each other in the second direction with the transmission area TA disposed therebetween.

Each of the first pixel group Pg1 and the second pixel group Pg2 may include pixels. The first pixel group Pg1 may include first pixels Pa1, and the second pixel group Pg2 may include second pixels Pa2. In FIG. 7, the first pixels Pa1 and the second pixels Pa2 may be arranged or disposed in the first direction, but in an embodiment, the first pixels Pa1 and the second pixels Pa2 may be arranged or disposed to form a matrix in the first direction and the second direction.

As described above with reference to FIG. 2, the data lines DL (for example, the first lines) may extend in the second direction in the display area DA. In an embodiment, the data lines DL may be electrically connected to the first pixel group Pg1. In this case, the first pixel group Pg1 may be most adjacent to the display area DA. The data lines DL may extend from pixels located or disposed in the display area DA and may be electrically connected to the first pixels Pa1 of the first pixel group Pg1. However, the disclosure is not limited thereto.

The data lines DL may be electrically connected to the first pixel group Pg1 and may not be electrically connected to the second pixel group Pg2. When the data lines DL are not electrically connected to the second pixel group Pg2, the data lines DL may be disconnected in the transmission area TA between the first pixel group Pg1 and the second pixel group Pg2.

In a comparative example, in the case where data lines extend from the first pixel group to the second pixel group, the data lines may be arranged or disposed to pass across the transmission area between the first pixel group and the second pixel group. A light transmittance of the transmission area may be reduced by the data lines arranged or disposed to pass across the transmission area. In this case, diffraction and reflection of light occur while the light passes between the data lines passing across the transmission area. Light passing between the data lines passing across the transmission area causes the distortion of a photographed image, such as light spreading or blurring in the case where a component such as a camera may be provided.

Therefore, the display device 1 according to an embodiment provides a structure in which the data lines DL may be disconnected between the first pixel group Pg1 and the second pixel group Pg2 such that the data lines DL may not pass across the transmission area TA, and a data signal may be received through connection lines (for example, third connection lines CL3) detouring around the first area CA. Through this, since the data lines DL may not pass across the transmission area TA, a light transmittance of the transmission area TA may be increased, and the occurrence of the distortion of an image due to the diffraction and reflection of light may be prevented.

In the first pixel group Pg1, the first pixels Pa1 may be respectively electrically connected to first connection lines CL1 extending in the first direction. In this case, when the first pixel Pa1 may be electrically connected to the first connection line CL1, the first connection line CL1 may be electrically connected to the pixel circuit PC of FIG. 5, by way of example. Since the first pixels Pa1 receive a data signal through the first connection lines CL1, each of the first connection lines CL1 may be electrically connected to the switching thin film transistor T2 of the pixel circuit PC. In this case, each of the first connection lines CL1 may be directly electrically connected to the switching thin film transistor T2, or electrically connected to the data lines DL to transfer a data signal to the switching thin film transistor T2.

Similarly to this, in the second pixel group Pg2, the second pixels Pa2 may be respectively electrically connected to the second connection lines CL2 extending in the first direction. Likewise, since the second pixels Pa2 may receive a data signal through the second connection lines CL2, each of the second connection lines CL2 may be electrically connected to the switching thin film transistor T2 of the pixel circuit PC of FIG. 5, by way of example.

Different from the first pixels Pa1, the second pixels Pa2 may be disconnected from the data lines DL and not electrically connected to the data lines DL. Therefore, as shown in FIG. 7, each of the second pixels Pa2 may include an auxiliary data line DL'. The pixel circuit PC, for example, the switching thin film transistor T2 may be electrically connected to the first connection line CL1 through the auxiliary data line DL'. Each of the second connection lines CL2 may be directly electrically connected to the switching thin film transistor T2 without passing through the auxiliary data line DL'.

The third connection lines CL3 may extend in the second direction and may be arranged or disposed in the third area PA. Each of the third connection lines CL3 may be electrically connected to the first connection lines CL1 and the second connection lines CL2 each extending in the first direction. In an embodiment, the first connection lines CL1 and the second connection lines CL2 may extend to the third area PA beyond the display area DA. The first connection lines CL1 may be respectively electrically connected to the third connection lines CL3 through first contact holes CNT1a, and the second connection lines CL2 may be respectively electrically connected to the third connection lines CL3 through second contact holes CNT2a.

In an embodiment, the first pixel Pa1 and the second pixel Pa2 arranged or disposed on the same column may be electrically connected to the same third connection line CL3. For example, a data signal transferred to the first pixel Pa1 through the data line DL may be transferred to the third connection line CL3 through the first connection line CL1, and transferred to the second pixel Pa2 on the same column through the second connection line CL2 electrically connected to the third connection line CL3. Through this, the first pixel Pa1 and the second pixel Pa2 on the same column may receive the same data signal even though the data line DL may be disconnected in the transmission area TA.

As shown in FIG. 7, the lines VL, SL-1, SL, and EL extending in the first direction may be arranged or disposed in the first area CA. The lines VL, SL-1, SL, and EL may be arranged or disposed in not only the first area CA but also the third area PA and the second or display area DA. The lines VL, SL-1, SL, and EL may be respectively the initialization voltage line VL, the previous scan line SL-1, the scan line SL, and the emission control line EL and may respectively supply an initialization voltage, a previous scan signal, a scan signal, and an emission control signal to the pixels. Similar to other connection lines in an embodiment, the lines VL, SL-1, SL, and EL may overlap the metal layer BML and may not overlap the transmission area TA. The metal layer BML may be arranged or disposed below the lines VL, SL-1, SL, and EL and may prevent the diffraction and the reflection of light by the lines VL, SL-1, SL, and EL.

Referring to FIG. 8 which enlarges a portion or region of the first pixel group Pg1 of FIG. 7, an end and another end of the first connection line CL1 may be electrically connected to the data line DL and the third connection line CL3 through contact holes CNT1a and CNT1b, respectively.

Referring to FIGS. 9A and 9B, the data line DL and the third connection line CL3 may be arranged or disposed on the same layer and may include the same or similar material. The first connection line CL1 may be arranged or disposed on a layer different from the data line DL and the third connection line CL3 and may include a different material. In this case, when an element is referred to as being arranged or disposed on the same layer or as including the same or similar material, the element may be formed by using a same mask process in a manufacturing process. An end and another end of the first connection line CL1 may be electrically connected to the data line DL and the third connection line CL3 through contact holes CNT1a and CNT1b, respectively.

In an embodiment, as shown in FIG. 9A, a first insulating layer IL1 may be arranged or disposed on the substrate 100, the data line DL and the third connection line CL3 may be arranged or disposed on the first insulating layer IL1, a second insulating layer IL2 may be arranged or disposed on the data line DL and the third connection line CL3, and the first connection line CL1 may be arranged or disposed on the second insulating layer IL2. The first connection line CL1 may be electrically connected to the data line DL and the third connection line CL3 through the contact holes CNT1a and CNT1b passing through the second insulating layer 1L2.

Referring to FIG. 6 together, in an embodiment, the data line DL and the third connection line CL3 may include the same or similar material as that of the source electrode SE and the drain electrode DE of the thin film transistor TFT. The first connection line CL1 may include the same or similar material as that of the contact metal layer CM. In this case, the first insulating layer IL1 may include the buffer layer 111, the first gate insulating layer 112, the second gate insulating layer 113, and the interlayer insulating layer 115. The second insulating layer IL2 may include the first planarization layer 117 and the second planarization layer 119. Some of the above-mentioned layers may be removed, or other layers may be added.

In an embodiment, as shown in FIG. 9B, the first insulating layer IL1 may be arranged or disposed on the substrate 100, the first connection line CL1 may be arranged or disposed on the first insulating layer IL1, the second insulating layer IL2 may be arranged or disposed on the first connection line CL1, and the data line DL and the third connection line CL3 may be arranged or disposed on the second insulating layer IL2. The first connection line CL1 may be electrically connected to the data line DL and the third connection line CL3 through the contact holes CNT1a and CNT1b passing through the second insulating layer IL2.

Referring to FIG. 6 together, in an embodiment, the data line DL and the third connection line CL3 may include the same or similar material as that of the source electrode SE and the drain electrode DE of the thin film transistor TFT. The first connection line CL1 may include the same or similar material as that of the top electrode CE2 of the storage capacitor Cst or the gate electrode GE.

For example, in the case where the first connection line CL1 includes the same or similar material as that of the top electrode CE2 of the storage capacitor Cst, the first insulating layer IL1 may include the buffer layer 111, the first gate insulating layer 112, and the second gate insulating layer 113. The second insulating layer IL2 may include the interlayer insulating layer 115, the first planarization layer 117, and the second planarization layer 119. For example, in the case where the first connection line CL1 includes the same or similar material as that of the gate electrode GE, the first insulating layer IL1 may include the buffer layer 111 and the first gate insulating layer 112. The second insulating layer IL2 may include the second gate insulating layer 113, the interlayer insulating layer 115, the first planarization layer 117, and the second planarization layer 119.

Although FIGS. 9A and 9B describe the first connection line CL1 as an example, the second connection line CL2 may have the same structure as that of the first connection line CL1. The first connection line CL1 and the second connection line CL2 may be arranged or disposed on the same layer and may include the same or similar material.

FIGS. 10 to 13 are plan views of a portion or a region of the display device 1 according to an embodiment. FIGS. 10 to 13 show a modification of FIG. 7.

Figure 10:
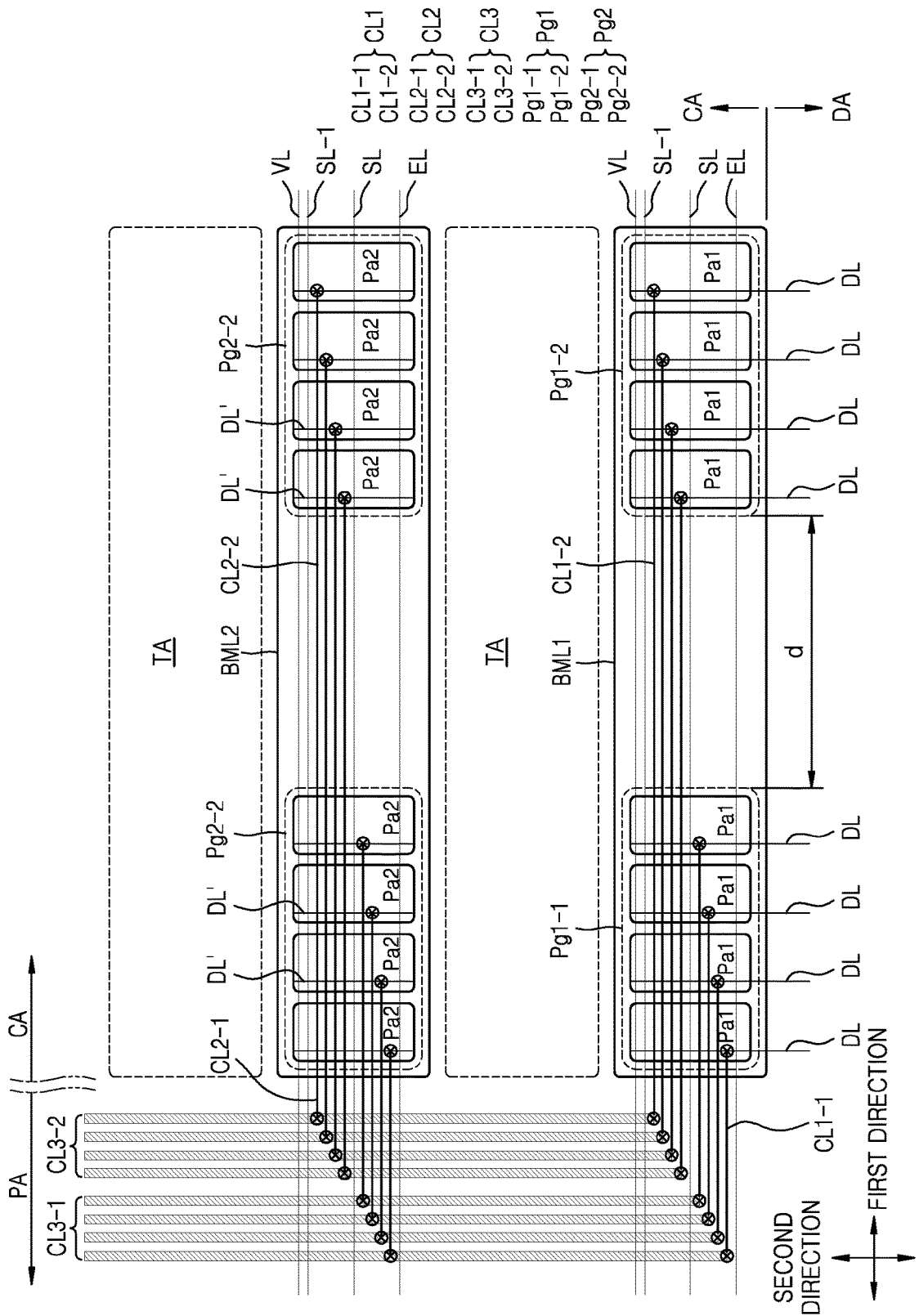
FIGS. 10 to 13 are plan views of a portion or a region of a display device according to an embodiment.

The embodiment shown in FIG. 10 may be substantially the same as the embodiment shown in FIG. 7 except that the first pixel group Pg1 and the second pixel group Pg2 may be provided in plural. Hereinafter, differences are mainly described and descriptions repeated in FIGS. 7, 8, 9A, and 9B are omitted.

Referring to FIG. 10, the first pixel group Pg1 and the second pixel group Pg2 may be provided in plural. The first pixel groups Pg1-1 and Pg1-2 may be apart from each other with a predetermined interval d in the first direction, and the second pixel groups Pg2-1 and Pg2-2 may be apart from each other with a predetermined interval d in the first direction. The transmission area TA may be arranged or disposed between the first pixel groups Pg1-1 and Pg1-2 and the second pixel groups Pg2-1 and Pg2-2. The first pixel groups Pg1-1 and Pg1-2 and the second pixel groups Pg2-1 and Pg2-2 may be apart from each other in the second direction with the transmission area TA disposed therebetween. In an embodiment, the area of the transmission area TA may be adjusted by adjusting the interval d between the first pixel groups Pg1-1 and Pg1-2 and the second pixel groups Pg2-1 and Pg2-2.

Each of the first pixel groups Pg1-1 and Pg1-2 and the second pixel groups Pg2-1 and Pg2-2 may include pixels. Each of the first pixel groups Pg1-1 and Pg1-2 may include first pixels Pa1, and each of the second pixel groups Pg2-1 and Pg2-2 may include second pixels Pa2.

The first pixel groups Pg1 may be respectively electrically connected to the first connection lines CL1 extending in the first direction. In an embodiment, the (1-1)st pixel group Pg1-1 may be electrically connected to the (1-1)st connection lines CL1-1, and the (1-2)nd pixel group Pg1-2 may be electrically connected to the (1-2)nd connection lines CL1-2. In this case, some or a predetermined number of the (1-2)nd connection lines CL1-2 may pass across the (1-1)st pixel group Pg1-1 and may overlap the (1-1)st pixel group Pg1-1.

Similarly, each of the second pixel groups Pg2 may be respectively electrically connected to the second connection lines CL2 extending in the first direction. In an embodiment, the (2-1)st pixel group Pg2-1 may be electrically connected to the (2-1)st connection lines CL2-1, and the (2-2)nd pixel group Pg2-2 may be electrically connected to the (2-2)nd connection lines CL2-2. In this case, some or a predetermined number of the (2-2)nd connection lines CL2-2 may pass across the (2-1)st pixel group Pg2-1 and may overlap the (2-1)st pixel group Pg2-1.

Third connection lines CL3-1 and CL3-2 extending in the second direction may be arranged or disposed outside the first area CA, for example, in the third area PA. The (1-1)st connection lines CL1-1 and the (2-1)st connection lines CL2-1 may be respectively electrically connected to the (3-1)st connection lines. The (1-2)nd connection lines CL1-2 and the (2-2)nd connection lines CL2-2 may be respectively electrically connected to the (3-2)nd connection lines CL3-2.

Figure 11:
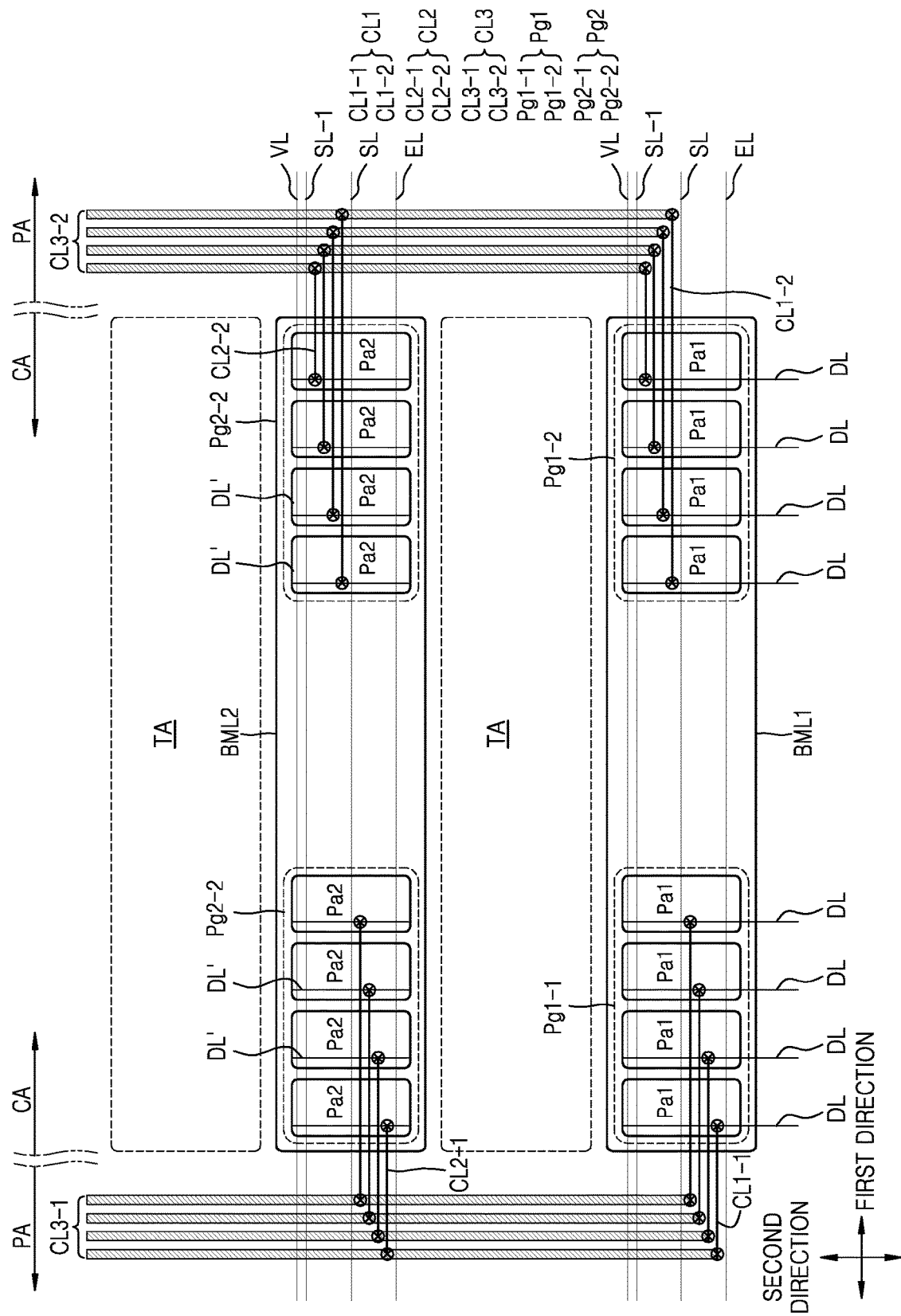

Referring to FIG. 11, the embodiment of FIG. 11 may be similar to the embodiment of FIG. 10 and may be different from the embodiment of FIG. 10 in that the third connection lines CL3-1 and CL3-2 may be provided or disposed on two opposite sides (for example the left side and the right side) of the first area CA.

The (3-1)st connection lines CL3-1 extending in the second direction may be located or disposed in the third area PA on a side of the first area CA, and the (3-2)nd connection lines CL3-2 extending in the second direction may be located or disposed in the third area PA on another side of the first area CA. The (3-1)st connection lines CL3-1 and the (3-2)nd connection lines CL3-2 may provide a data signal to pixel groups arranged or disposed on the same column.

In an embodiment, the (1-1)st pixel group Pg1-1 may be electrically connected to the (1-1)st connection lines CL1-1, and the (2-1)st pixel group Pg2-1 may be electrically connected to the (2-1)st connection lines CL2-1. The (1-1)st connection lines CL1-1 and the (2-1)st connection lines CL2-1 may be respectively electrically connected to the (3-1)st connection lines CL3-1.

Similarly, the (1-2)nd pixel group Pg1-2 may be electrically connected to the (1-2)nd connection lines CL1-2, and the (2-2)nd pixel group Pg2-2 may be electrically connected to the (2-2)nd connection lines CL2-2. The (1-2)nd connection lines CL1-2 and the (2-2)nd connection lines CL2-2 may be respectively electrically connected to the (3-2)nd connection lines CL3-2.

In this case, different from FIG. 10, the (1-2)nd connection lines CL1-2 may not overlap the (1-1)st pixel group Pg1-1. The first connection lines CL1-1 and CL1-2 electrically connected to the first pixel groups Pg1-1 and Pg1-2 may be respectively electrically connected to neighboring third connection lines CL3-1 and CL3-2 among the neighboring third connection lines CL3-1 and CL3-2. Therefore, the (1-2)nd connection lines CL1-2 may not overlap the (1-1)st pixel group Pg1-1, and the (1-1)st connection lines CL1-1 may not overlap the (1-2)nd pixel group Pg1-2. This may be equally applied to second pixel groups Pg2.

Although the embodiment of FIG. 7 describes the structure in which the data lines DL extending in the second direction may be disconnected in the transmission area TA, the embodiment may be applicable to the lines VL, SL-1, SL, and EL extending in the first direction.

Figure 12:
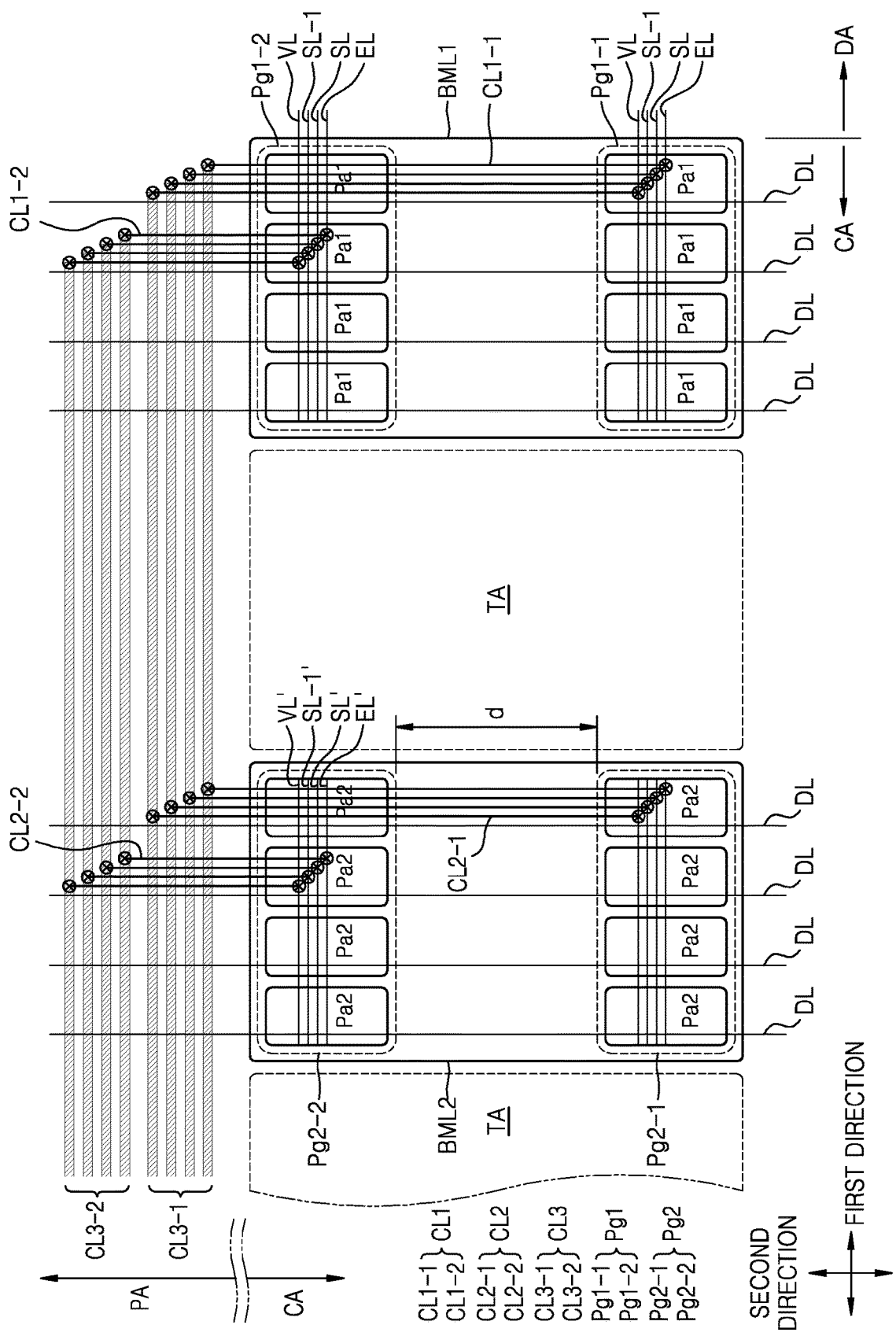

Referring to FIG. 12 first, the first pixel groups Pg1-1 and Pg1-2 may be apart from each other with a predetermined interval d in the second direction, and the second pixel groups Pg2-1 and Pg2-2 may be apart from each other with a predetermined interval d in the second direction. The transmission area TA may be located or disposed between the first pixel groups Pg1-1 and Pg1-2 and the second pixel groups Pg2-1 and Pg2-2, and the first pixel groups Pg1-1 and Pg1-2 and the second pixel groups Pg2-1 and Pg2-2 may be apart from each other in the first direction with the transmission area TA disposed therebetween. In an embodiment, the area of the transmission area TA may be adjusted by adjusting the interval d between the first pixel groups Pg1-1 and Pg1-2 and the second pixel groups Pg2-1 and Pg2-2.

The first pixel groups Pg1 may be respectively electrically connected to the first connection lines CL1 extending in the second direction. In an embodiment, the (1-1)st pixel group Pg1-1 may be electrically connected to the (1-1)st connection lines CL1-1, and the (1-2)nd pixel group Pg1-2 may be electrically connected to the (1-2)nd connection lines CL1-2. In this case, some or a predetermined number of the (1-1)st connection lines CL1-1 may pass across the (1-2)nd pixel group Pg1-2 and others or the remainder of the (1-1)st connection lines CL1-1 may overlap the (1-2)nd pixel group Pg1-2.

Similarly, the second pixel groups Pg2 may be respectively electrically connected to the second connection lines CL2 extending in the second direction. In an embodiment, the (2-1)st pixel group Pg2-1 may be electrically connected to the (2-1)st connection lines CL2-1, and the (2-2)nd pixel group Pg2-2 may be electrically connected to the (2-2)nd connection lines CL2-2. In this case, some or a predetermined number of the (2-1)st connection lines CL2-1 may pass across the (2-2)nd pixel group Pg2-2 and others or the remainder of the (2-1)st connection lines CL2-1 may overlap the (2-2)nd pixel group Pg2-2.

The third connection lines CL3-1 and CL3-2 extending in the first direction may be arranged or disposed outside the first area CA, for example, in the third area PA. The (1-1)st connection lines CL1-1 and the (2-1)st connection lines CL2-1 may be respectively electrically connected to the (3-1)st connection lines. The (1-2)st connection lines CL1-2 and the (2-2)nd connection lines CL2-2 may be respectively electrically connected to the (3-2)nd connection lines CL3-2.

An embodiment shows that the third connection lines CL3-1 and CL3-2 each may include four lines, and the four lines may respectively transfer the initialization voltage, a previous scan signal, a scan signal, and an emission control signal to each pixel.

Auxiliary lines VL', SL-1', SL', and EL' each extending in the first direction may be arranged or disposed in the second pixel groups Pg2. The auxiliary lines VL', SL-1', SL', and EL' may respectively transfer the initialization voltage, a previous scan signal, a scan signal, and an emission control signal to second pixels Pa2 on the same row.

Figure 13:
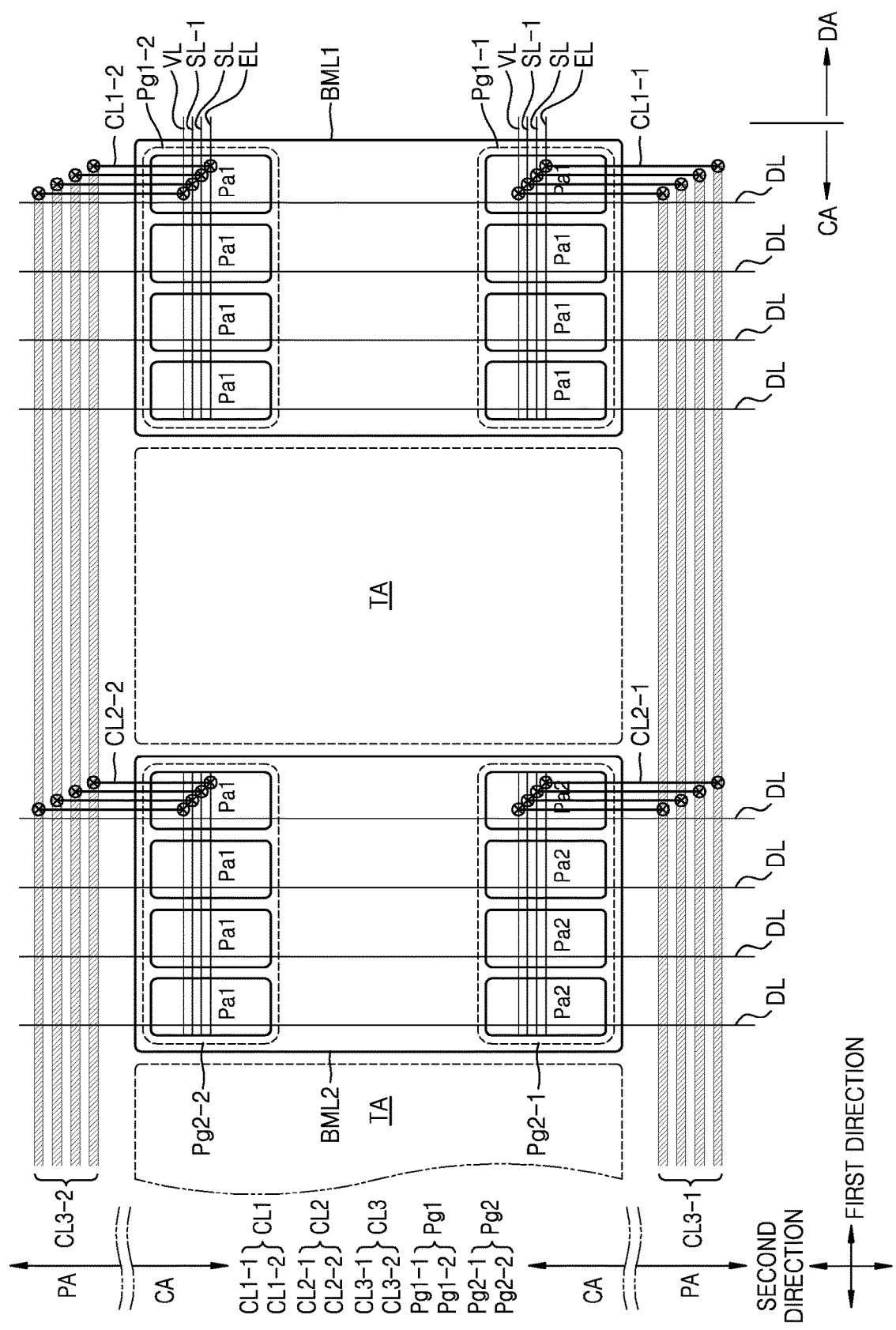

The embodiment of FIG. 13 may be similar to the embodiment of FIG. 12 but may be different from the embodiment of FIG. 12 in that the third connection lines CL3-1 and CL3-2 may be provided or disposed in two opposite sides (for example, a top side and a bottom side) of the first area CA.

Multiple (3-1)st connection lines CL3-1 extending in the second direction may be located or disposed in the third area PA on a side (a bottom side) of the first area CA, and (3-2)nd connection lines CL3-2 extending in the second direction may be located or disposed in the third area PA on another side (a top side) of the first area CA. The (3-1)st connection lines CL3-1 and the (3-2)nd connection lines CL3-2 each may transfer the initialization voltage, a previous scan signal, a scan signal, and an emission control signal to pixel groups on the same row.

FIGS. 14A to 14D are views showing a pixel arrangement of the display device 1 according to an embodiment. FIGS. 14A to 14D show a pixel arrangement of the first area CA.

Figure 14A:
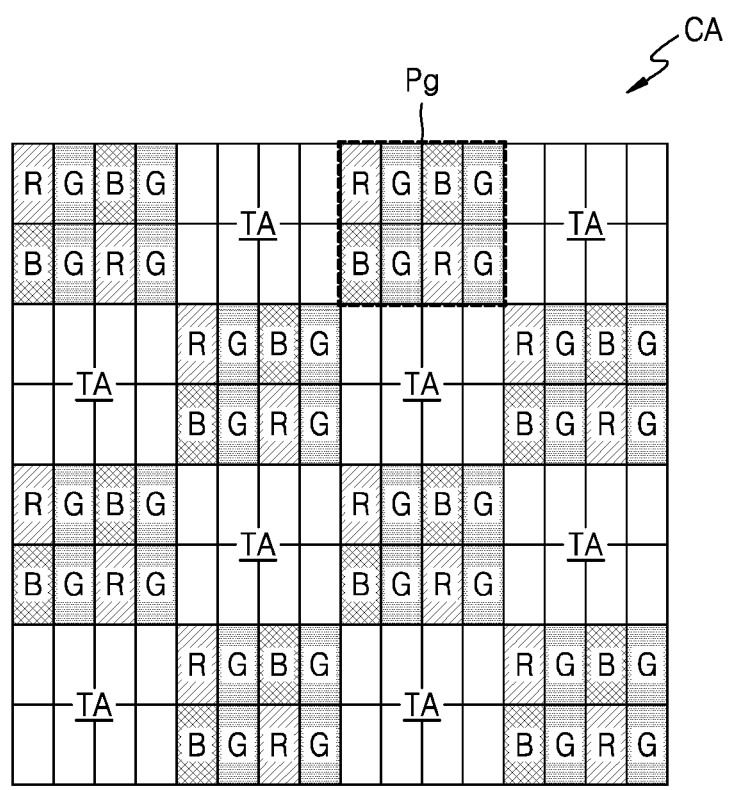
FIGS. 14A to 14D are views showing a pixel arrangement of a display device according to an embodiment.

Referring to FIG. 14A, transmission areas TA may be arranged or disposed between pixel groups Pg. The pixel groups Pg and the transmission areas TA may be alternately arranged or disposed. In the case where the first area CA has the pixel arrangement of FIG. 14A, the resolution of the first area CA may be about ½ of the resolution of the display area DA.

Figure 14B:
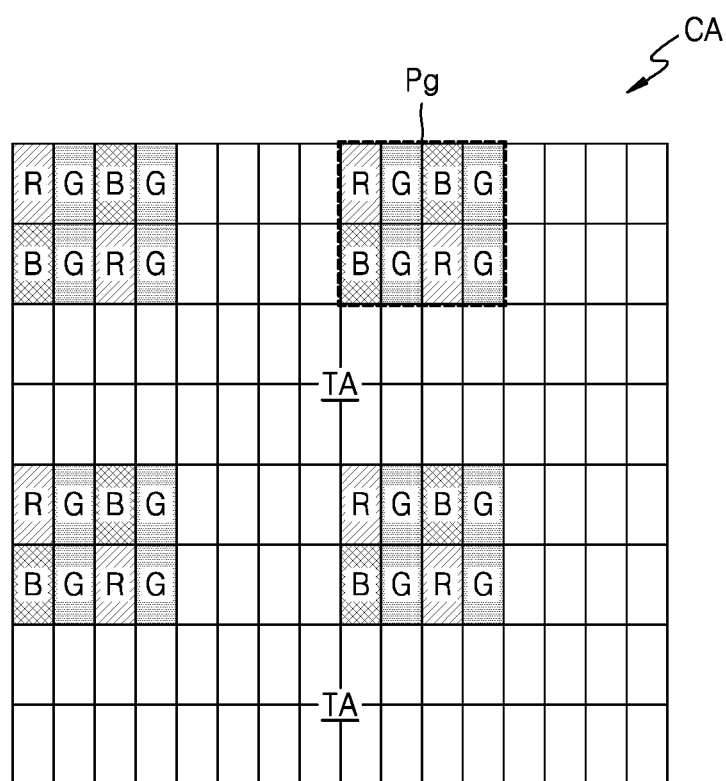

Similarly, referring to FIG. 14B, the transmission areas TA may be arranged or disposed between the pixel groups Pg, and the transmission areas TA may have a structure in which the transmission areas TA may be connected to each other as one body. In the case where the first area CA has the pixel arrangement of FIG. 14B, the resolution of the first area CA may be about ¼ of the resolution of the display area DA.

Figure 14C:
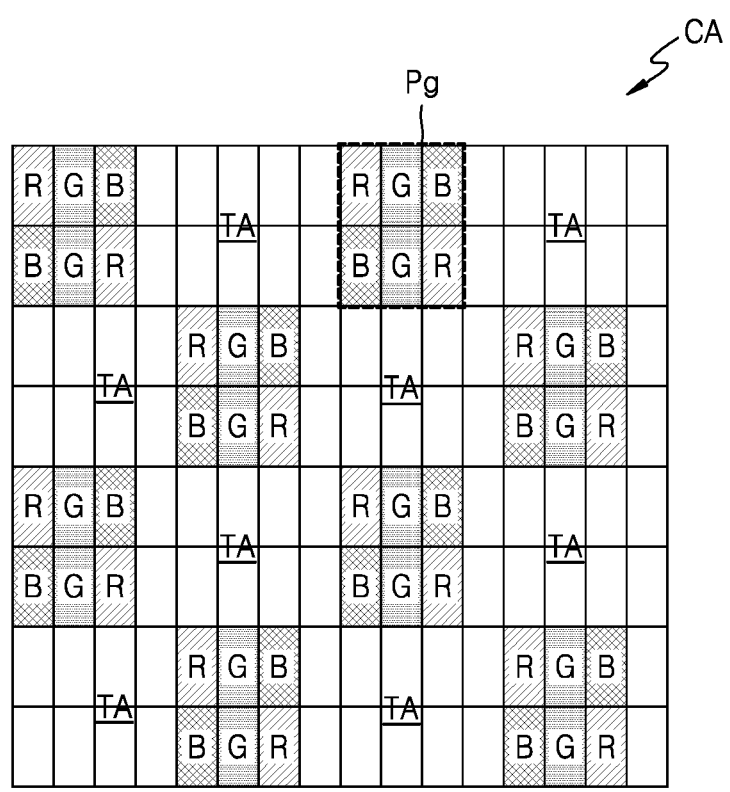
Figure 14D:
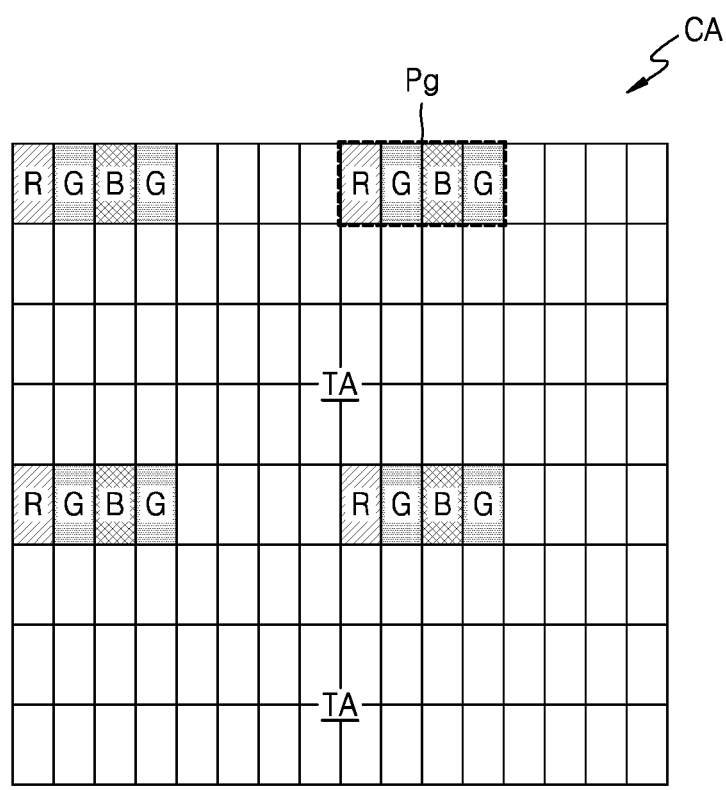

Referring to FIG. 14C, the resolution of the first area CA may be about ⅜ of the resolution of the display area DA. Referring to FIG. 14D, the resolution of the first area CA may be about 1/16 of the resolution of the display area DA.

The first area CA may have the pixel arrangement shown in FIGS. 14A to 14D. In an embodiment, the first area CA may have a pixel arrangement structure that is partially different. For example, the first area CA may employ a structure in which a pixel arrangement having a relatively high resolution is applied to a portion of the first area CA that may neighbor the display area DA, and the area of the transmission area TA may widen toward a central portion thereof. In an embodiment, the display device 1 may have a pixel arrangement structure in which the first area CA may be provided in plural and the first areas CA respectively may have different pixel arrangement structures.

Up to now, descriptions have been mainly made to the display device 1, however, the embodiment is not limited thereto. For example, a method of manufacturing the display device also falls within the scope of the disclosure.

According to an embodiment, a display panel including an extended display area such that an image may be displayed even in a region in which a component may be arranged or disposed, and a display device including the display panel may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including a first area including a transmission area, a second area, and a third area, the second area and the third area being adjacent to the first area;
   a first pixel group and a second pixel group each disposed in the first area, the transmission area being disposed between the first pixel group and the second pixel group;
   a plurality of first connection lines extending in a first direction and electrically connected to a plurality of first pixels of the first pixel group;
   a plurality of second connection lines extending in the first direction and electrically connected to a plurality of second pixels of the second pixel group; and
   a plurality of third connection lines extending in a second direction and disposed in the third area, the plurality of third connection lines being electrically connected to the plurality of first connection lines and the plurality of second connection lines,
   wherein the second direction intersects the first direction.

2. The display panel of claim 1, further comprising a plurality of wirings extending in the second direction in the second area,
   wherein the plurality of wirings are electrically connected to the first pixel group and disconnected between the first pixel group and the second pixel group.

3. The display panel of claim 2, wherein the plurality of wirings include a data line supplying a data signal.

4. The display panel of claim 3, wherein the plurality of wirings and the plurality of third connection lines are disposed on a same layer.

5. The display panel of claim 1, wherein the plurality of first connection lines and the plurality of second connection lines are disposed on a same layer.

6. The display panel of claim 1, further comprising a plurality of auxiliary wirings extending in the second direction and electrically connected to the plurality of second pixels.

7. The display panel of claim 6, wherein the plurality of second connection lines are electrically connected to the plurality of auxiliary wirings.

8. The display panel of claim 1, further comprising a first metal layer disposed in the first area,
   wherein the first metal layer overlaps the first pixel group and the plurality of first connection lines.

9. The display panel of claim 8, further comprising a second metal layer disposed in the first area, the second metal layer being apart from the first metal layer,
   wherein the second metal layer overlaps the second pixel group and the plurality of second connection lines.

10. The display panel of claim 9, wherein the first metal layer and the second metal layer receive a constant voltage from a conductive line.

11. The display panel of claim 9, wherein each of the plurality of first pixels and the plurality of second pixels includes a pixel circuit including a thin-film transistor,
    the thin-film transistor includes a semiconductor layer and a gate electrode overlapping at least a portion of the semiconductor layer, and
    the first metal layer and the second metal layer are disposed between the substrate and the semiconductor layer.

12. The display panel of claim 1, wherein the third area includes a non-display area surrounding the second area.

13. The display panel of claim 1, wherein the third area surrounds at least a portion of the first area and is disposed between the first area and the second area.

14. The display panel of claim 1, further comprising:
    a first conductive layer disposed over the substrate; and
    a second conductive layer disposed over the first conductive layer, wherein
    an insulating layer is disposed between the first conductive layer and the second conductive layer,
    the plurality of third connection lines and the first conductive layer include a same material, and
    the plurality of first connection lines and the plurality of second connection lines and the second conductive layer include a same material.

15. The display panel of claim 1, wherein
    each of the plurality of first pixels and the plurality of second pixels includes:
    a display element and
    a pixel circuit including a thin-film transistor,
    the thin-film transistor includes:
    a semiconductor layer;
    a gate electrode overlapping at least a portion of the semiconductor layer; and
    an electrode layer electrically connected to the semiconductor layer, and
    the plurality of third connection lines and the electrode layer include a same material.

16. The display panel of claim 15, wherein
    each of the plurality of first pixels and the plurality of second pixels includes a contact metal layer disposed between the display element and the thin-film transistor and electrically connecting the display element to the thin-film transistor, and
    the plurality of first connection lines and the plurality of second connection lines and the contact metal layer include a same material.

17. The display panel of claim 1, wherein the first area is at least partially surrounded by the second area.

18. The display panel of claim 1, wherein a resolution of the first area is lower than a resolution of the second area.

19. A display device comprising:
    a display panel including a substrate that includes a first area including a transmission area, a second area, and a third area, and the second area and the third area being disposed adjacent to the first area; and
    a component arranged to correspond to the first area of the display panel,
    wherein the display panel includes:
    a first pixel group and a second pixel group each disposed in the first area, the transmission area being between the first pixel group and the second pixel group;

a plurality of first connection lines extending in a first direction and electrically connected to a plurality of first pixels of the first pixel group;

a plurality of second connection lines extending in the first direction and electrically connected to a plurality of second pixels of the second pixel group; and a plurality of third connection lines extending in a second direction and disposed in the third area, the plurality of third connection lines being electrically connected to the plurality of first connection lines and the plurality of second connection lines, the second direction intersects the first direction.

20. The display device of claim 19, wherein the component includes an imaging element.

* * * * *